(12) United States Patent
Cha et al.

(10) Patent No.: US 12,396,297 B2
(45) Date of Patent: Aug. 19, 2025

(54) LIGHT-EMITTING ELEMENT AND DISPLAY DEVICE INCLUDING THE SAME

(71) Applicant: Samsung Display Co., LTD., Yongin-si (KR)

(72) Inventors: Hyung Rae Cha, Seoul (KR); Dong Uk Kim, Hwaseong-si (KR); Dong Kyun Seo, Asan-si (KR); Young Chul Sim, Pyeongtaek-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 643 days.

(21) Appl. No.: 17/675,052

(22) Filed: Feb. 18, 2022

(65) Prior Publication Data

US 2023/0018385 A1 Jan. 19, 2023

(30) Foreign Application Priority Data

Jul. 19, 2021 (KR) ........................ 10-2021-0094040

(51) Int. Cl.
*H10H 20/825* (2025.01)
*H10H 20/831* (2025.01)

(52) U.S. Cl.
CPC ...... *H10H 20/825* (2025.01); *H10H 20/8312* (2025.01)

(58) Field of Classification Search
CPC ... H01L 33/32; H01L 33/382; H01L 25/0753; H01L 33/20; H01L 33/44; H01L 25/167;
(Continued)

(56) References Cited

U.S. PATENT DOCUMENTS

| 9,112,112 B2 | 8/2015 | Do et al. |
| 9,455,373 B2 | 9/2016 | Yokozeki et al. |

(Continued)

FOREIGN PATENT DOCUMENTS

| JP | 2013-110374 | 6/2013 |
| KR | 10-2007-0020840 | 2/2007 |

(Continued)

OTHER PUBLICATIONS

International Search Report, corresponding to International Application No. PCT/KR2022/010505 dated Nov. 2, 2022.
(Continued)

*Primary Examiner* — William B Partridge
*Assistant Examiner* — Felix B Andrews
(74) *Attorney, Agent, or Firm* — KILE PARK REED & HOUTTEMAN PLLC

(57) ABSTRACT

A light-emitting element and a display device including the same are provided. The light-emitting element comprising: a light-emitting element core including a first semiconductor layer, a second semiconductor layer disposed on the first semiconductor layer, and a light-emitting layer disposed between the first semiconductor layer and the second semiconductor layer, a nitride insulating film surrounding a side face of the light-emitting element core, a first element insulating film surrounding an outer side face of the nitride insulating film, and a second element insulating film surrounding an outer side face of the first element insulating film, wherein a thickness of the nitride insulating film is smaller than each of a thickness of the first element insulating film and a thickness of the second element insulating film.

20 Claims, 16 Drawing Sheets

(58) Field of Classification Search
CPC ... H01L 27/156; H01L 33/0012; H01L 33/36; H10H 20/825; H10H 20/819; H10H 20/84
See application file for complete search history.

(56) References Cited

U.S. PATENT DOCUMENTS

| | | | |
|---|---|---|---|
| 10,418,519 | B2 | 9/2019 | Bour et al. |
| 10,923,626 | B2 | 2/2021 | Bour et al. |
| 2015/0034963 | A1* | 2/2015 | Kinouchi ............ H10H 20/841 257/76 |
| 2018/0226543 | A1* | 8/2018 | Masui ................. H10H 20/819 |
| 2018/0286915 | A1* | 10/2018 | Yeon ....................... H01L 33/62 |
| 2019/0305035 | A1* | 10/2019 | Cho ........................ H01L 33/40 |
| 2019/0378953 | A1* | 12/2019 | Min ...................... H01L 27/156 |
| 2020/0295229 | A1* | 9/2020 | Kim ..................... H01L 33/382 |
| 2020/0403129 | A1* | 12/2020 | Lee ......................... H01L 33/62 |
| 2021/0083152 | A1* | 3/2021 | Biebersdorf .......... H01L 33/405 |
| 2021/0111323 | A1* | 4/2021 | Kim ..................... H10K 59/122 |
| 2021/0167050 | A1 | 6/2021 | Cho et al. |
| 2022/0028922 | A1* | 1/2022 | Park ..................... H01L 33/382 |
| 2022/0037568 | A1* | 2/2022 | Kwag .................... H01L 33/50 |
| 2022/0045244 | A1* | 2/2022 | Yoo ........................ H01L 33/44 |
| 2022/0052108 | A1* | 2/2022 | Park ........................ H01L 33/62 |
| 2022/0140199 | A1* | 5/2022 | DiMaria .............. H10H 20/841 |
| 2023/0187418 | A1* | 6/2023 | Do ...................... H01L 25/0753 257/79 |
| 2024/0047505 | A1* | 2/2024 | Daanoune ............... H01L 33/10 |

FOREIGN PATENT DOCUMENTS

| | | | |
|---|---|---|---|
| KR | 10-1244926 | 3/2013 | |
| KR | 10-1436123 | 11/2014 | |
| KR | 10-2015-0006798 | 1/2015 | |
| KR | 10-2016-0059569 | 5/2016 | |
| KR | 10-2019-0137941 | 12/2019 | |
| KR | 10-2020-0021014 | 2/2020 | |
| WO | WO-2020013407 A1 * | 1/2020 | ......... H01L 25/0753 |
| WO | 2022-050512 | 3/2022 | |

OTHER PUBLICATIONS

Written Opinion, corresponding to International Application No. PCT/KR2022/010505, dated Nov. 2, 2022.

* cited by examiner

LIGHT-EMITTING ELEMENT AND DISPLAY DEVICE INCLUDING THE SAME

CROSS-REFERENCE TO RELATED APPLICATION(S)

This application claims priority to and the benefits of Korean Patent Application No. 10-2021-0094040 under 35 U.S.C. § 119, filed in the Korean Intellectual Property Office (KIPO) on Jul. 19, 2021, and the entire contents of which are incorporated herein by reference.

BACKGROUND

1. Technical Field

The disclosure relates to a light-emitting element and a display device including the same.

2. Description of Related Art

Importance of a display device is increasing along with development of multimedia. Thus, various types of the display devices such as an organic light-emitting display device (OLED), a liquid crystal display device (LCD), etc. are being used.

The display device includes a display panel for displaying an image, such as an organic light-emitting display panel or a liquid crystal display panel. The display panel may include a light-emitting element. The light-emitting element may be embodied as a light-emitting diode (LED). The light-emitting diode includes an organic light-emitting diode (OLED) using an organic material as a light-emitting material, and an inorganic light-emitting diode using an inorganic material as a light-emitting material.

SUMMARY

A technical purpose of the disclosure is to provide a light-emitting element capable of reducing a surface defect of a light-emitting element core and improving efficiency and reliability of the light-emitting element and a display device including the same.

Also, a technical purpose of the disclosure is to provide a light-emitting element in which a first element insulating film directly disposed on a side face of a light-emitting element core including semiconductor layers is embodied as a nitride insulating film, and a surface defect of the light-emitting element core is reduced, thereby improving efficiency and reliability of the light-emitting element.

Further, a technical purpose of the disclosure is to provide a light-emitting element in which a thickness of a nitride insulating film disposed directly on a side face of a light-emitting element core including semiconductor layers is smaller than each of a thickness of a second element insulating film and a thickness of a third element insulating film such that crystallinity of the nitride insulating film is maintained, thereby effectively preventing diffusion of impurities.

Furthermore, a technical purpose of the disclosure is to provide a display device including a light-emitting element in which a first element insulating film directly disposed on a side face of a light-emitting element core including semiconductor layers is embodied as a nitride insulating film, and a surface defect of the light-emitting element core is reduced, thereby improving efficiency and reliability of the element.

Purposes according to the disclosure are not limited to the above-mentioned purpose. Other purposes and advantages according to the disclosure that are not mentioned may be understood based on following descriptions, and may be more clearly understood based on embodiments according to the disclosure. Further, it will be readily understood that the purposes and advantages according to the disclosure may be realized using means shown in the claims and combinations thereof.

According to an embodiment of the disclosure, a light-emitting element comprising: a light-emitting element core including a first semiconductor layer, a second semiconductor layer disposed on the first semiconductor layer, and a light-emitting layer disposed between the first semiconductor layer and the second semiconductor layer, a nitride insulating film surrounding a side face of the light-emitting element core, a first element insulating film surrounding an outer side face of the nitride insulating film, and a second element insulating film surrounding an outer side face of the first element insulating film, wherein a thickness of the nitride insulating film is smaller than each of a thickness of the first element insulating film and a thickness of the second element insulating film.

An inner side face of the nitride insulating film may contact the side face of the light-emitting element core.

The side face of the light-emitting element core may include at least one of a side face of the first semiconductor layer, a side face of the second semiconductor layer, and a side face of the light-emitting layer.

A thickness of the nitride insulating film may be in a range of about 1 nm to about 5 nm.

A dielectric constant of the first element insulating film may be greater than a dielectric constant of the second element insulating film.

An etching rate of the second element insulating film may be different from an etching rate of the first element insulating film.

The first element insulating film may have a dielectric constant of about 10 or greater and an energy gap of about 3 eV or higher.

The nitride insulating film may have a thickness equal to or smaller than a critical thickness.

The nitride insulating film may include at least one of $AlN_x$ and $SiN_x$.

The first element insulating film may include at least one of silicon oxide ($SiO_x$), aluminum oxide ($Al_xO_y$), hafnium silicon oxide ($HfSiO_x$), scandium oxide ($Sc_xO_y$), hafnium oxide ($HfO_x$), zirconium oxide ($ZrO_x$), strontium oxide (SrO), yttrium oxide ($Y_xO_y$), tantalum oxide ($Ta_xO_y$), barium oxide (BaO), tungsten oxide ($WO_x$), titanium oxide ($TiO_x$), and lanthanum oxide ($La_xO_y$).

According to an embodiment of the disclosure, a light-emitting element comprising: a light-emitting element core including a first semiconductor layer, a light-emitting layer disposed on the first semiconductor layer, and a second semiconductor layer disposed on the light-emitting layer, a first element insulating film surrounding a side face of the light-emitting element core, a second element insulating film surrounding an outer side face of the first element insulating film, and a third element insulating film surrounding an outer side face of the second element insulating film, wherein the first element insulating film has a thickness in a range of about 1 nm to about 5 nm.

The first element insulating film may include a nitride-based insulating material.

A thickness of the second element insulating film may be greater than a thickness of the first element insulating film, and a thickness of the third element insulating film may be greater than the thickness of the first element insulating film.

The first element insulating film may contact the side face of the light-emitting element core, and the side face of the light-emitting element core may include at least one of a side face of the first semiconductor layer, a side face of the second semiconductor layer, and a side face of the light-emitting layer.

A dielectric constant of the second element insulating film may be greater than a dielectric constant of the third element insulating film.

According to an embodiment of the disclosure, a display device comprising: a first electrode and a second electrode disposed on a substrate and spaced apart from each other; and a light-emitting element disposed on the first electrode and the second electrode, wherein the light-emitting element includes: a light-emitting element core including a first semiconductor layer, a second semiconductor layer disposed on the first semiconductor layer, and a light-emitting layer disposed between the first semiconductor layer and the second semiconductor layer, a nitride insulating film surrounding a side face of the light-emitting element core, a first element insulating film surrounding an outer side face of the nitride insulating film, and a second element insulating film surrounding an outer side face of the first element insulating film, and a thickness of the nitride insulating film is smaller than each of a thickness of the first element insulating film and a thickness of the second element insulating film.

An inner side face of the nitride insulating film may contact the side face of the light-emitting element core.

A thickness of the nitride insulating film may be in a range of about 1 nm to about 5 nm.

A dielectric constant of the first element insulating film may be greater than a dielectric constant of the second element insulating film.

The nitride insulating film may have a thickness equal to or smaller than a critical thickness.

Specific details of other embodiments are included in following detailed descriptions and drawings.

The light-emitting element according to an embodiment includes the light-emitting element core including the semiconductor layers, and the first insulating film, the second element insulating film, and the third element insulating film element that surround the side face (an outer circumferential face) of the light-emitting element core and are sequentially disposed thereon. The first element insulating film may be embodied as the nitride insulating film including a nitride-based insulating material. The first element insulating film may be disposed directly on the outer circumferential face of the light-emitting element core. Thus, a surface defect of the light-emitting element core that may occur during a manufacturing process of the light-emitting element may be reduced, and diffusion of impurities (e.g., oxygen) from the second element insulating film or the third element insulating film into the semiconductor layers of the light-emitting element core may be prevented. The first element insulating film may have a thickness smaller than or equal to a predefined thickness such that crystallinity of a material of the first element insulating film may be maintained, thereby effectively preventing the impurities from diffusing from the second element insulating film and/or the third element insulating film to the semiconductor layers of the light-emitting element core. Thus, element efficiency (or light-emitting efficiency) and reliability of the light-emitting element may be improved.

The display device according to an embodiment may include the above-mentioned light-emitting element having the improved element efficiency and reliability, and have improved display quality.

Effects according to the embodiments are not limited to the effects as described above. Rather, various effects are included herein.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

The invention will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," or the like may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
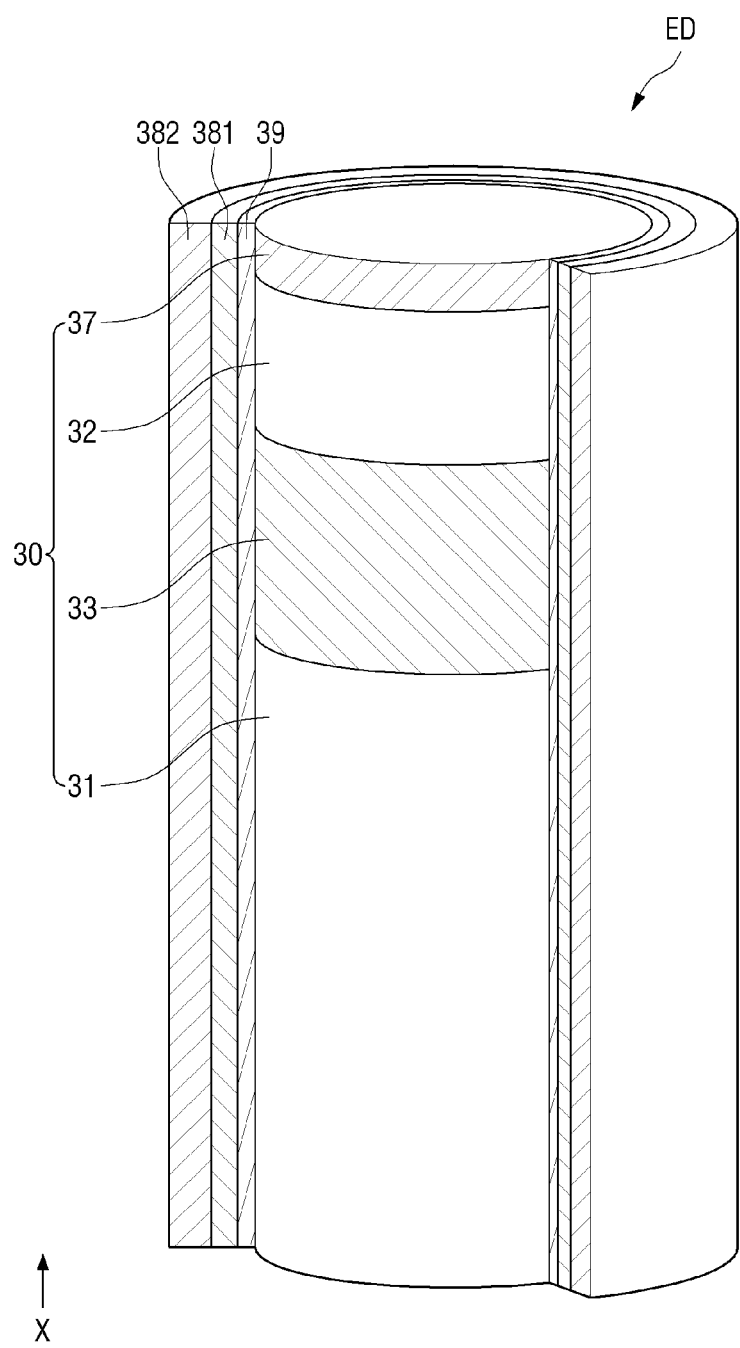
FIG. 1 is a schematic perspective view of a light-emitting element according to an embodiment.
Figure 2:
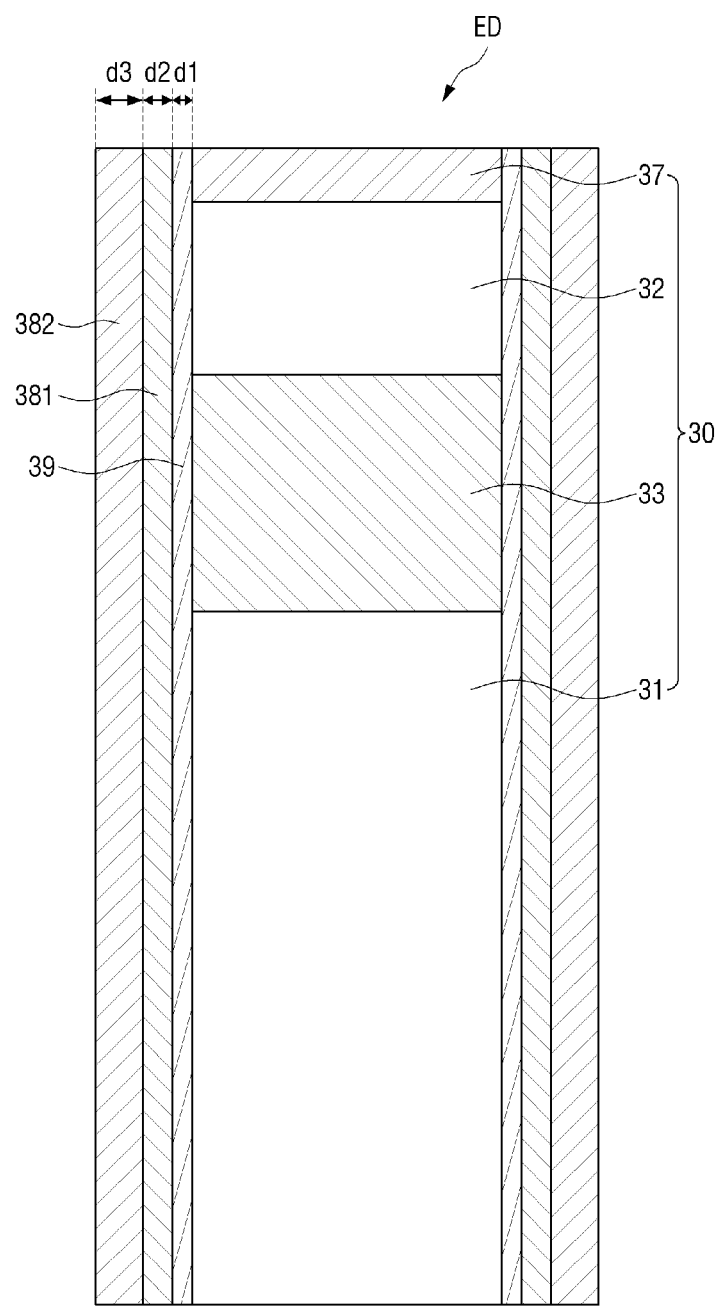
FIG. 2 is a schematic cross-sectional view of a light-emitting element according to an embodiment.

FIG. 1 is a schematic perspective view of a light-emitting element according to an embodiment. FIG. 2 is a schematic cross-sectional view of a light-emitting element according to an embodiment.

Referring to FIGS. 1 and 2, a light-emitting element ED may be a particle-like element, and may have a rod or cylindrical shape with a predefined (or selected) aspect ratio. The light-emitting element ED may have a shape extending in a direction X. A length in the extending direction X (or longitudinal direction) of the light-emitting element ED may be greater than a diameter of the light-emitting element ED. The aspect ratio may be in a range of about 1.2:1 to about 100:1. However, the disclosure is not limited thereto. For example, the light-emitting element ED may have a shape of a cylinder, a rod, a wire, a tube, or the like, or may have a shape of a polygonal prism such as a cube, a cuboid, or a hexagonal prism, or may have a shape that extends in a direction and has a partially inclined outer face. Hereinafter, in the drawings illustrating the shape of the light-emitting element ED, the terms "a/the direction X", "the extension direction X of the light-emitting element ED", and "the length direction X of the light-emitting element ED" may be used in an interchangeable manner with each other.

The light-emitting element ED may have a size of a nanometer scale (greater than or equal to 1 nm and smaller than 1 µm) to a micrometer scale (greater than or equal to 1 µm and smaller than 1 mm). In an embodiment, both a diameter and a length of the light-emitting element ED may have a size of a nanometer scale, or may have a size of a micrometer scale. In some other embodiments, the diameter of the light-emitting element ED may have a size of a nanometer scale, while the length of the light-emitting element ED may have a size of a micrometer scale. In some embodiments, each of some of light-emitting elements ED may have a size of a nanometer scale in diameter and/or length thereof, while each of the other of the light-emitting elements ED may have a size of a micrometer scale in diameter and/or length thereof.

In an embodiment, the light-emitting element ED may be embodied as or implemented with, for example, an inorganic light-emitting diode. The inorganic light-emitting diode may include semiconductor layers. For example, the inorganic light-emitting diode may include a first conductivity type (e.g., an n-type) semiconductor layer, a second conductivity type (e.g., a p-type) semiconductor layer, and an active semiconductor layer interposed therebetween. The active semiconductor layer may receive holes and electrons from the first conductivity type semiconductor layer and the second conductivity type semiconductor layer, respectively. Thus, the holes and electrons reaching the active semiconductor layer may be combined with each other to emit light. In case that an electric field is generated between the two electrodes facing each other and in a specific direction, the inorganic light-emitting diodes may be uniformly oriented between two electrodes having different polarities.

The light-emitting element ED may include a light-emitting element core 30, a first element insulating film 39, a second element insulating film 381, and a third element insulating film 382.

The light-emitting element core 30 may have a shape extending in the direction X. The light-emitting element core 30 may have a rod or cylindrical shape. However, the disclosure is not limited thereto. The light-emitting element core 30 may have a shape of a polygonal prism, such as a cube, a cuboid, a hexagonal prism, or the like, or may have a shape extending in the direction X and having an outer face as partially inclined.

The light-emitting element core 30 may include a first semiconductor layer 31, a second semiconductor layer 32, a light-emitting layer 33, and an element electrode layer 37. The first semiconductor layer 31, the light-emitting layer 33, the second semiconductor layer 32, and the element electrode layer 37 may be sequentially stacked in the direction X as the longitudinal direction of the light-emitting element core 30.

The first semiconductor layer 31 may be doped with a first conductivity type dopant. The first conductivity type may be an n-type, and the first conductivity type dopant may include at least one of Si, Ge, and Sn. However, the first conductivity type dopant is not limited thereto. For example, the first semiconductor layer 31 may act as an n-type semiconductor. In an embodiment, the first semiconductor layer 31 may be made of n-GaN doped with the n-type dopant Si.

The second semiconductor layer 32 may be spaced apart from the first semiconductor layer 31, and the light-emitting layer 33 may be interposed between the first semiconductor layer 31 and the second semiconductor layer 32. The second semiconductor layer 32 may be doped with a second conductivity type dopant. The second conductivity type may be a p-type, and the second conductivity type dopant may include at least one of Mg, Zn, Ca, Se, and Ba. However, the second conductivity type dopant is not limited thereto. For example, the second semiconductor layer 32 may act as a p-type semiconductor. In an embodiment, the second semiconductor layer 32 may be made of p-GaN doped with the p-type dopant Mg.

In an example, the drawing shows that each of the first semiconductor layer 31 and the second semiconductor layer 32 is composed of a single layer. However, the disclosure is not limited thereto. Each of the first semiconductor layer 31 and the second semiconductor layer 32 may further include a larger number of layers, such as a clad layer or a tensile strain barrier reducing (TSBR) layer, depending on a material of the light-emitting layer 33.

The light-emitting layer 33 may be disposed between the first semiconductor layer 31 and the second semiconductor layer 32. The light-emitting layer 33 may include a material having a single quantum well structure or a multiple quantum wells structure. In the light-emitting layer 33, electrons and holes may be recombined with each other based on an electrical signal applied thereto through the first semiconductor layer 31 and the second semiconductor layer 32, thereby emitting light. For example, in case that the light-emitting layer 33 emits light in a blue wavelength band, the light-emitting layer 33 may include, for example, AlGaN, AlGaInN, or the like.

In some embodiments, the light-emitting layer 33 may have a structure in which a semiconductor material having a large bandgap energy and a semiconductor material having a small bandgap energy are alternately stacked with each other. The light-emitting layer 33 may include a group III-V compound semiconductor material other than AlGaN or AlGaInN, depending on a wavelength band of the emitted light. Light emitted from the light-emitting layer 33 may not be limited to light in the blue wavelength band, and may be in a red or green wavelength band in some cases.

The light emitted from the light-emitting layer 33 may be outputted through opposing end faces in the direction X (e.g., the longitudinal direction of the light-emitting element ED) and through a side face of the light-emitting element ED. A direction in which the light emitted from the light-emitting layer 33 is outputted is not limited to one direction.

In case that electrodes are electrically connected respectively to both opposing ends of the light-emitting element ED to apply an electrical signal to the first semiconductor layer 31 and the second semiconductor layer 32, the element electrode layer 37 may be disposed between the second semiconductor layer 32 and one of the electrodes and reduce electrical resistance between the second semiconductor layer 32 and the electrode. The element electrode layer 37 may include at least one of aluminum (Al), titanium (Ti), indium (In), gold (Au), silver (Ag), ITO (Indium Tin Oxide), IZO (Indium Zinc Oxide), or ITZO (Indium Tin-Zinc Oxide). The element electrode layer 37 may include a semiconductor material doped with an n-type or p-type dopant.

The first element insulating film 39 may surround a side face (or outer circumferential face) of the light-emitting element core 30. The first element insulating film 39 may surround side faces of the layers (e.g., first semiconductor layer 31, second semiconductor layer 32, light-emitting layer 33, element electrode layer 37, or the like) included in the light-emitting element core 30. The first element insulating film 39 may surround at least side faces of the first semiconductor layer 31, the light-emitting layer 33, and the second semiconductor layer 32, and may extend in the direction X in which the light-emitting element core 30 extends. For example, the first element insulating film 39 may further surround the side face of the element electrode layer 37.

The first element insulating film 39 may surround the side face of the light-emitting element core 30 and expose the opposing end faces of the light-emitting element core 30. The first element insulating film 39 may not be disposed on the opposing end faces (or a top face and a bottom face of light-emitting element core 30 in FIG. 1) of the light-emitting element core 30, such that the element electrode layer 37 and the first semiconductor layer 31 of the light-emitting element core 30 may be exposed out of the first element insulating film 39.

The first element insulating film 39 may include a nitride-based insulating material. For example, the first element insulating film 39 may be embodied as a nitride insulating film 39. In an embodiment, the first element insulating film 39 may include AlN or SiNx. Hereinafter, for convenience of description herein, the first element insulating film 39 and the nitride insulating film 39 having the same reference numeral '39' may be used interchangeably with each other.

The first element insulating film 39 may be disposed directly on the side face of the light-emitting element core 30. The first element insulating film 39 may directly contact the side face of the light-emitting element core 30. Accordingly, an inner side face of the first element insulating film 39 may contact (or be in contact with) the side face of the light-emitting element core 30. As the first element insulating film 39 includes the nitride-based insulating material and is formed directly on the side face of the light-emitting element core 30, the first element insulating film 39 may reduce a surface defect occurring on the side faces of the first semiconductor layer 31, the second semiconductor layer 32, and the light-emitting layer 33 of the light-emitting element core 30. The surface defect occurring on the side face of the light-emitting element core 30 may be a defect occurring on an exposed surface of an outermost semiconductor layer in an etching process for forming the light-emitting element core 30 during a manufacturing process of the light-emitting element ED, as will be described below. Further, the first element insulating film 39 may be interposed between the light-emitting element core 30 and the second element insulating film 381 and thus may prevent impurities from diffusing from the second element insulating film 381 or the third element insulating film 382 into the semiconductor layer (e.g., the first semiconductor layer 31, the second semiconductor layer 32 or the light-emitting layer 33) of the light-emitting element core 30.

The second element insulating film 381 may be disposed on an outer side face (or outer circumferential face) of the first element insulating film 39. The second element insulating film 381 may surround the outer side face of the first element insulating film 39.

The second element insulating film 381 may surround the outer side face of the first element insulating film 39 and extend in the direction X. In a similar manner to the first element insulating film 39, the second element insulating film 381 may cover the side face of the light-emitting element core 30, and expose the opposing end faces of the light-emitting element core 30. Although the drawing shows that the second element insulating film 381 extends in the length direction X of the light-emitting element ED so as to cover the side faces of the first semiconductor layer 31, the second semiconductor layer 32, the light-emitting layer 33, and the element electrode layer 37, the disclosure is not limited thereto. For example, the second element insulating film 381 may cover only the side faces of some of the semiconductor layers including the side face of the light-emitting layer 33. As another example, the second element insulating film 381 may cover a partial area of the side face of the element electrode layer 37, and expose another partial area of the side face of element electrode layer 37.

The second element insulating film 381 may include a material having insulating ability. In an embodiment, the second element insulating film 381 may include an insulating material having an energy gap (or band gap) of about 3 electron volts (eV) or greater and a high permittivity (high-k). As used herein, the term "high permittivity" may mean that a dielectric constant K is about 10 or greater. For example, the second element insulating film 381 may include an insulating material having a dielectric constant (or permittivity) of about 10 or greater. In an embodiment, an example of an insulating material having an energy gap of about 3 electron volts (eV) or greater, and a dielectric constant (or permittivity) of about 10 or greater may include at least one of silicon oxide ($SiO_x$), aluminum oxide ($Al_xO_y$), hafnium silicon oxide (HfSiO$_x$), scandium oxide (Sc$_x$O$_y$), hafnium oxide (HfO$_x$), zirconium oxide (ZrO$_x$), strontium oxide (SrO), yttrium oxide (Y$_x$O$_y$), tantalum oxide (Ta$_x$O$_y$), barium oxide (BaO), tungsten oxide (WO$_x$), titanium oxide (TiO$_x$), lanthanum oxide (La$_x$O$_y$), etc.

The second element insulating film 381 may include an insulating material having an energy gap of about 3 electron volts (eV) or greater and a dielectric constant (or permittivity) of about 10 or greater, and thus may allow a band-bending effect to occur in the light-emitting layer 33 to increase electron injection efficiency and improve low gray-scale efficiency, thereby improving light-emitting efficiency of the light-emitting element ED.

The second element insulating film 381 may protect the first semiconductor layer 31, the second semiconductor layer 32 and the light-emitting layer 33 of the light-emitting element core 30. The second element insulating film 381 may prevent electrical short circuit that may occur in case that the electrode for transmitting an electrical signal to the light-emitting element ED and the light-emitting layer 33 directly contact each other. For example, the second element insulating film 381 may electrically insulate the light-emitting layer 33 from the electrode for transmitting the electrical signal to the light-emitting element ED. Further, the second element insulating film 381 may include an insulating material having a high permittivity and an energy gap of about 3 electron volts (eV) or greater, and thus may increase the electron injection efficiency due to the band-banding effect, thereby improving the light-emitting efficiency of the light-emitting element ED.

The third element insulating film 382 may be disposed on an outer side face (or outer circumferential face) of the second element insulating film 381. The third element insulating film 382 may surround the outer side face of the second element insulating film 381.

The third element insulating film 382 may surround the outer side face of the second element insulating film 381 and may extend in the direction X. In a similar manner to the first and second element insulating films 39 and 381, the third element insulating film 382 may cover the side face of the light-emitting element core 30, and expose the opposing end faces of the light-emitting element core 30. Although the drawing shows that the third element insulating film 382 extends in the length direction X of the light-emitting element ED so as to cover the side faces of the first semiconductor layer 31, the second semiconductor layer 32, the light-emitting layer 33, and the element electrode layer 37, the disclosure is not limited thereto.

The third element insulating film 382 may protect the second element insulating film 381. For example, the third element insulating film 382 may surround the outer side face of the second element insulating film 381, and prevent damage to the second element insulating film 381 and/or the light-emitting element core 30 in a process of forming the second insulating layer 520 and/or other members of the display device 10 during the manufacturing process of the display device 10 to be described below.

FIGS. 1 and 2 show that the third element insulating film 382 completely covers the outer side face of the second element insulating film 381. However, the disclosure is not limited thereto. For example, the third element insulating film 382 may expose a portion of the outer side face of the second element insulating film 381 on an end portion of the light-emitting element ED at which the element electrode layer 37 is disposed. For example, the portion of the outer side face of the second element insulating film 381, which is disposed on the end portion of the light-emitting element ED and adjacent to the element electrode layer 37, may be exposed by the third element insulating film 382.

The third element insulating film 382 may include a material with insulating ability. In an embodiment, the third element insulating film 382 may include an insulating material having a permittivity different from that of the second element insulating film 381. Specifically, the third element insulating film 382 may include an insulating material having a smaller permittivity than that of the second element insulating film 381. In an embodiment, the third element insulating film 382 may include aluminum oxide (AlxO$_y$) or aluminum nitride (Al$_x$N$_y$) having a permittivity different from that of the second element insulating film 381. The third element insulating film 382 may include a material having an etching rate lower than that of the second element insulating film 381 in case that an etchant is used in a dry etching process during the manufacturing process of the display device 10 to be described below. However, the disclosure is not limited thereto. Accordingly, even though the third element insulating film 382 forming (or constituting) an outermost face of the light-emitting element ED is exposed to the etchant used in the manufacturing process of the display device 10, the third element insulating film 382 may stably protect the light-emitting element core 30 and the second element insulating film 381 because the etching rate of the third element insulating film 382 using the etchant is relatively low.

In an example, the first element insulating film 39, the second element insulating film 381, and the third element insulating film 382 may have predefined thicknesses to improve the light-emitting efficiency and reliability of the light-emitting element ED. For example, a thickness d1 of the first element insulating film 39, a thickness d2 of the second element insulating film 381, and a thickness d3 of the third element insulating film 382 may be different from each other.

In an embodiment, the thickness d1 of the first element insulating film 39 may be smaller than the thickness d2 of the second element insulating film 381. The thickness d1 of the first element insulating film 39 may be smaller than the thickness d3 of the third element insulating film 382. Because the thickness d1 of the first element insulating film 39 is smaller than each of the thickness d2 of the second element insulating film 381 and the thickness d3 of the third element insulating film 382, the first element insulating film 39 may reduce the surface defect of the light-emitting element core 30, and at the same time, may effectively prevent the impurities from the second element insulating film 381 and/or the third element insulating film 382 from diffusing into the semiconductor layers (e.g., first semiconductor layer 31, second semiconductor layer 32, light-emitting layer 33, or the like) of the light-emitting element core 30.

The thickness d3 of the third element insulating film 382 may be greater than the thickness d2 of the second element insulating film 381. However, the disclosure is not limited thereto. In case that the thickness d3 of the third element insulating film 382 is greater than the thickness d2 of the second element insulating film 381, the third element insulating film 382 may stably protect the second element insulating film 381 and the light-emitting element core 30 in the manufacturing process of the display device 10.

In an embodiment, the thickness d2 of the second element insulating film 381 may be in a range of about 10 nm to about 15 nm. The thickness d3 of the third element insulating film 382 may be in a range of about 40 nm to about 60 nm. However, the disclosure is not limited thereto. Each of the thickness d2 of the second element insulating film 381 and the thickness d3 of the third element insulating film 382 may have a value other than the above-mentioned range and included in a range greater than the thickness d1 of the first element insulating film 39. For example, the thickness d2 of the second element insulating film 381 and the thickness d3 of the third element insulating film 382 may be greater than the thickness d1 of the first element insulating film 39 and different from the above-described thicknesses.

In an embodiment in which the first element insulating film 39 includes the nitride-based insulating material, in case that the first element insulating film 39 has similar characteristics to those of an insulating film having a single crystal (hereinafter, a single crystal insulating film), the first element insulating film 39 may effectively prevent the impurities from diffusing from the second element insulating film 381 and/or the third element insulating film 382 into the semiconductor layers of the light-emitting element core 30. In this connection, in order that the first element insulating film 39 has the similar characteristics to those of the single crystal insulating film, the thickness d1 of the first element insulating film 39 may be equal to or smaller than a critical thickness. As used herein, the term 'critical thickness' may be defined as a thickness at which a thin film maintains a single crystal structure in a process of forming the thin film.

In case that the first element insulating film 39 effectively prevents the impurities from diffusing from the second element insulating film 381 and/or the third element insulating film 382 into the semiconductor layers of the light-emitting element core 30, the thickness d1 of the first element insulating film 39 may be equal to or smaller than the critical thickness of a material of the first element insulating film 39 and equal to or greater than a minimum thickness at which the first element insulating film 39 may prevent the diffusion of the impurities. In an embodiment in which the first element insulating film 39 includes AlN, the thickness d1 of the first element insulating film 39 may be in a range of 1 nm to 5 nm or in a range of about 2 nm to about 3 nm.

Specifically, in an embodiment in which the first element insulating film 39 includes AlN, in case that the thickness d1 of the first element insulating film 39 is smaller than or equal to 5 mm, the first element insulating film 39 may have the similar characteristics to those of the single crystal insulating film. In case that the thickness d1 of the first element insulating film 39 is equal to or greater than 1 nm, the first element insulating film 39 may prevent the impurities from diffusing from the second element insulating film 381 and the third element insulating film 382 into the semiconductor layers of the light-emitting element core 30. In case that at least one of the second element insulating film 381 or the third element insulating film 382 contains oxygen, the first element insulating film 381 may prevent the diffusion of the oxygen from the second element insulating film 381 or the third element insulating film 382 into the semiconductor layers of the light-emitting element core 30 to reduce the light-emitting efficiency or reliability of the light-emitting element ED.

Figure 3:
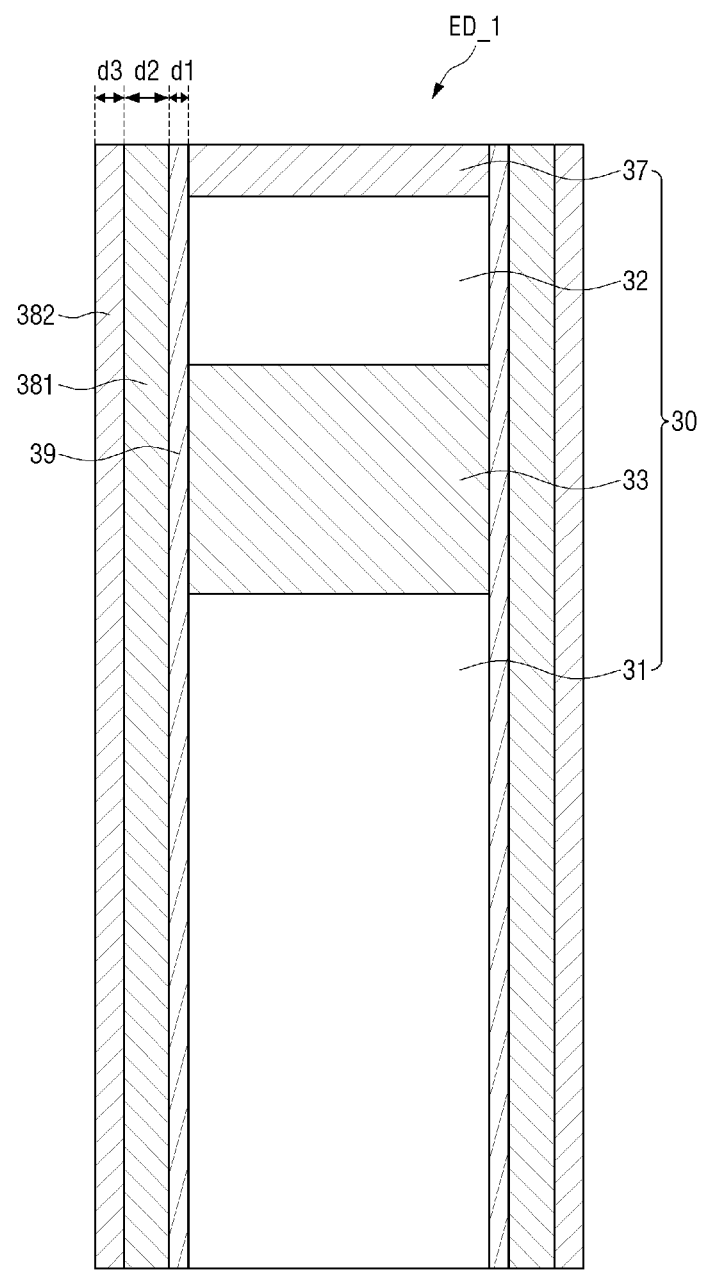
FIG. 3 is a schematic cross-sectional view of a light-emitting element according to another embodiment.
Figure 4:
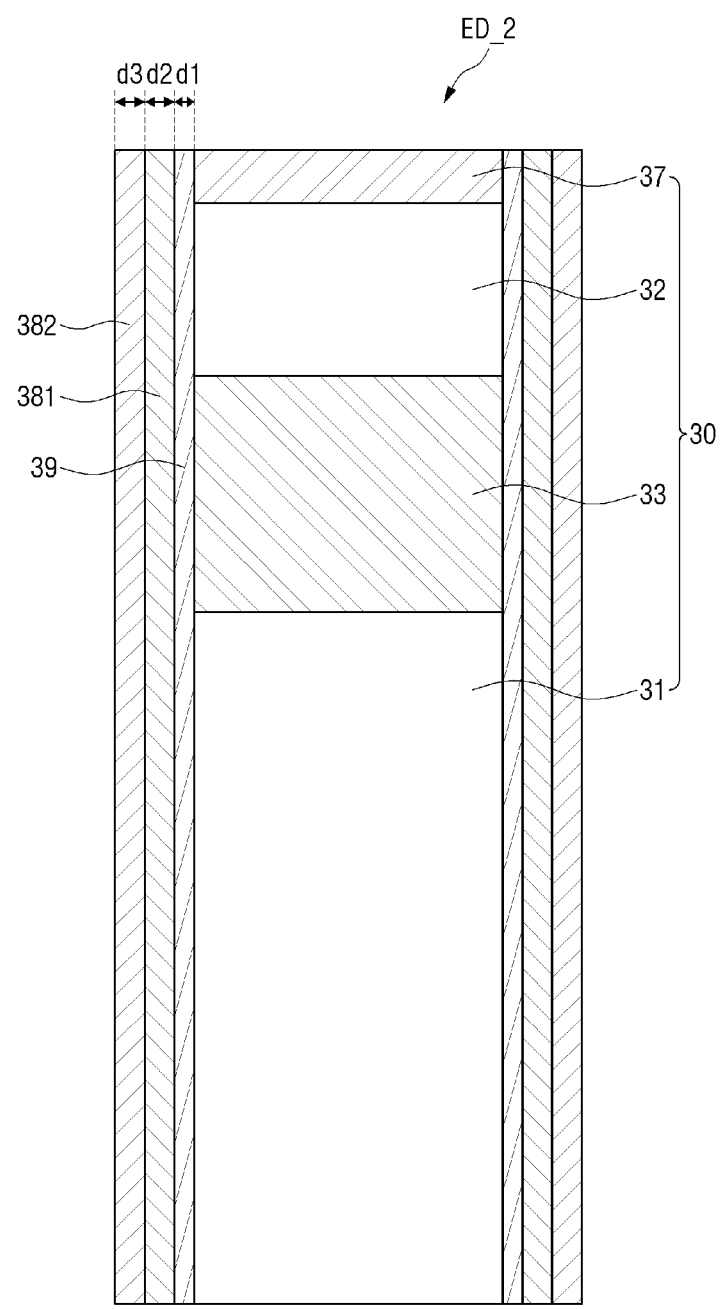
FIG. 4 is a schematic cross-sectional view of a light-emitting element according to still another embodiment.

FIG. 3 is a schematic cross-sectional view of a light-emitting element according to another embodiment. FIG. 4 is a schematic cross-sectional view of a light-emitting element according to still another embodiment.

Referring to FIG. 3, a light-emitting element ED according to the embodiment is different from the light-emitting element ED according to the embodiment in FIG. 2 at least in that the second thickness d2 of the second element insulating film 381 is greater than the third thickness d3 of the third element insulating film 382. Referring to FIG. 4, a light-emitting element ED according to the embodiment is different from the light-emitting element ED according to the embodiment in FIG. 2 at least in that the second thickness d2 of the second element insulating film 381 and the third thickness d3 of the third element insulating film 382 are equal to each other.

Referring to FIGS. 3 and 4, each of the thickness d2 of the second element insulating film 381 and the thickness d3 of the third element insulating film 382 may have a range of about 10 nm to about 200 nm. The disclosure is not limited thereto. The thickness d2 of the second element insulating film 381 and the thickness d3 of the third element insulating film 382 may be adjusted within a range of about 40 nm to about 120 nm, and the second thickness d2 of the second element insulating film 381 may be equal to or greater than the third thickness d3 of the third element insulating film 382.

Hereinafter, with reference to other drawings, a manufacturing process of the light-emitting element ED according to an embodiment will be described in a sequential manner.

FIGS. 5 to 10 are schematic cross-sectional views of steps of a method for manufacturing a light-emitting element according to an embodiment.

Hereinafter, in the drawings of the embodiment for illustrating the manufacturing process of the light-emitting element ED, a first direction DR1, a second direction DR2, and a third direction DR3 are defined. The first direction DR1 and the second direction DR2 may be perpendicular to each other, and the third direction DR3 may be normal to a plane defined by the first direction DR1 and the second direction DR2.

The third direction DR3 may be a direction parallel to a direction X (e.g., the extension direction of the light-emitting element ED formed on an underlying substrate 1000). In an embodiment for describing the manufacturing process of the light-emitting element ED, unless otherwise stated, a "top" refers to a side in the third direction DR3, and "upward" refers to a direction in which semiconductor layers of the light-emitting element ED are stacked on a face (or top face) of the underlying substrate 1000, and a "top face" indicates a surface facing toward a side in the third direction DR3. In an embodiment for describing the manufacturing process of the light-emitting element ED, unless otherwise stated, a "bottom" refers to an opposite side in the third direction DR3, and a "bottom face" indicates a surface facing toward the opposite side in the third direction DR3.

Figure 5:
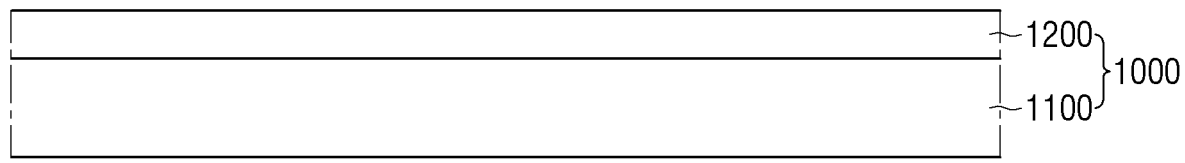
FIGS. 5 to 10 are schematic cross-sectional views of steps of a method for manufacturing a light-emitting element according to an embodiment.
Figure 5:
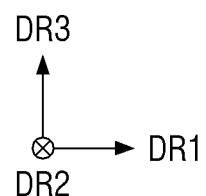

Referring to FIG. 5, the method may include preparing the underlying substrate 1000. For example, the underlying substrate 1000 may be prepared in the method for manufacturing the light-emitting element ED (e.g., refer to FIG. 10).

For example, the underlying substrate 1000 may include a base substrate 1100 and a buffer material layer 1200 disposed on the base substrate 1100.

The base substrate 1100 may include a sapphire substrate ($Al_xO_y$) or a transparent substrate such as a glass substrate. However, the disclosure is not limited thereto. The base substrate 1100 may include a conductive substrate made of at least one of GaN, SiC, ZnO, Si, GaP, and GaAs. In an embodiment, the base substrate 1100 may be embodied as a sapphire substrate ($Al_xO_y$).

The semiconductor layers may be formed on the base substrate 1100. The semiconductor layers may be formed by growing a seed crystal on the base substrate 1100 using epitaxial growth. A method for forming the semiconductor layers may include electron beam evaporation, physical vapor deposition (PVD), chemical vapor deposition (CVD), plasma laser deposition (PLD), dual-type thermal evaporation, sputtering, metal organic chemical vapor deposition (MOCVD), etc.

The buffer material layer 1200 may be formed on a face (or top face) of the base substrate 1100. The buffer material layer 1200 may reduce a difference between lattice constants of the base substrate 1100 and a first semiconductor material layer 3100 (refer to FIG. 6) to be described below. The buffer material layer 1200 may include an undoped semiconductor. The buffer material layer 1200 and the first semiconductor layer 3100 may include a same material. The buffer material layer 1200 may not be doped with a first conductivity type dopant or a second conductivity type dopant, for example, an n-type or p-type dopant. Although the drawing shows that the buffer material layer 1200 is composed of a single layer, the buffer material layer 1200 may be composed of multiple layers. The buffer material layer 1200 may be omitted depending on a type of the base substrate 1100.

Figure 6:
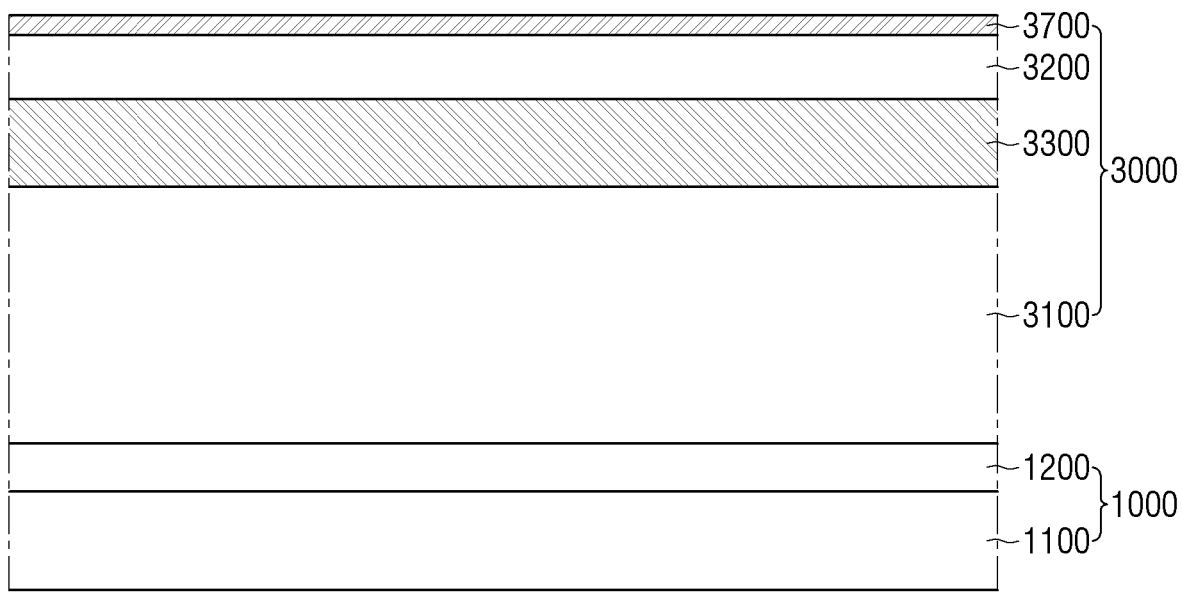

Referring to FIG. 6, a first stack structure 3000 may be formed on the underlying substrate 1000.

For example, the first semiconductor material layer 3100, a light-emitting material layer 3300, a second semiconductor material layer 3200, and an electrode material layer 3700 may be sequentially stacked on the underlying substrate 1000, and the first stack structure 3000 may be formed on the underlying substrate 1000.

The layers (e.g., first semiconductor layer 3100, light-emitting layer 3300, second semiconductor layer 3200, and electrode layer 3700) included in the first stack structure 3000 may respectively correspond to the layers (e.g., first semiconductor layer 31, second semiconductor layer 32, light-emitting layer 33, and element electrode layer 37 of FIG. 1) included in the light-emitting element core 30 (e.g., refer to FIG. 1) according to an embodiment. For example, the first semiconductor material layer 3100, the light-emitting material layer 3300, the second semiconductor material layer 3200 and the electrode material layer 3700 of the first stack structure 3000 may correspond to the first semiconductor layer 31 (e.g., refer to FIG. 1), the light-emitting layer 33 (e.g., refer to FIG. 1), the second semiconductor layer 32 (e.g., refer to FIG. 1), and the element electrode layer 37 (e.g., refer to FIG. 1) of the light-emitting element core 30 (e.g., refer to FIG. 1), respectively. For example, the first semiconductor layer 3100, the light-emitting layer 3300, the second semiconductor layer 3200 and the electrode layer 3700 of the first stack structure 3000 may respectively include the same materials as the first semiconductor layer 31 (e.g., refer to FIG. 1), the light-emitting layer 33 (e.g., refer to FIG. 1), the second semiconductor layer 32 (e.g., refer to FIG. 1), and the element electrode layer 37 (e.g., refer to FIG. 1) of the light-emitting element core 30 (e.g., refer to FIG. 1).

Figure 7:
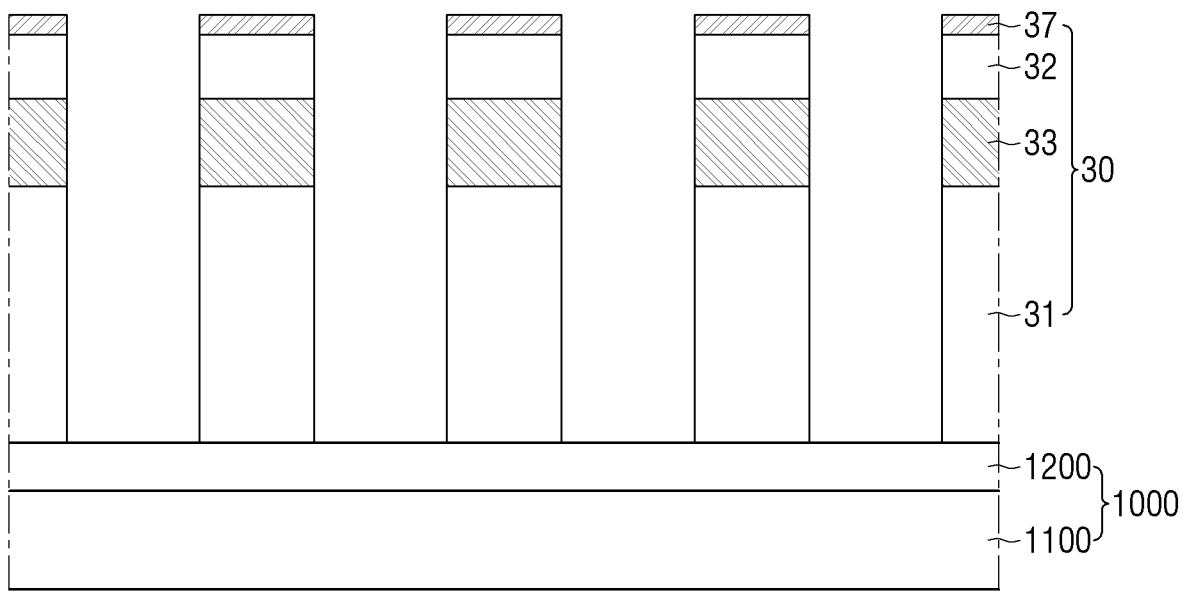

Referring to FIG. 7, the first stack structure 3000 may be etched to form light-emitting element cores 30 spaced apart from each other.

For example, the light-emitting element cores 30 spaced apart from each other as shown in FIG. 7 may be formed using a process of etching the first stack structure 3000 (refer to FIG. 6) in a direction normal to the top face of the underlying substrate 1000, for example, the third direction DR3. The first stack structure 3000 (refer to FIG. 6) may be etched using a conventional patterning scheme. For example, the patterning scheme may include forming an etch mask layer on a top face of the first stack structure 3000 (refer to FIG. 6), and etching the first stack structure 3000 (refer to FIG. 6) along the etch mask layer in the third direction DR3.

For example, the process of etching the first stack structure 3000 (refer to FIG. 6) may include dry etching, wet etching, reactive ion etching (RIE), inductively coupled plasma reactive ion etching (ICP-RIE), or the like. The dry etching may allow anisotropic etching and may be suitable for vertical etching. In an embodiment, the etching of the first stack structure 3000 (refer to FIG. 6) may be performed using a combination of dry etching and wet etching. For example, drying etching may be first carried out in the third direction DR3, and then, wet etching as isotropic etching may be performed such that a resulting sidewall may extend in a direction (e.g., third direction DR3) normal to the top face of underlying substrate 1000.

In an example, a surface of each of the light-emitting element cores 30 formed by etching the first stack structure 3000 (refer to FIG. 6) may have defects due to the etchant used in the etching process. For example, the semiconductor layer (e.g., first semiconductor layer 31, second semiconductor layer 32, light-emitting layer 33, and element electrode layer 37) included in each of the light-emitting element cores 30 may have a defect of a semiconductor material in a surface thereof. For example, the surface defect may occur on each of the side faces of the first semiconductor layer 31, the second semiconductor layer 32, and the light-emitting layer 33 of the light-emitting element core 30. The surface defect may be a defect occurring on the surface of each of the semiconductor layers (e.g., first semiconductor layer 31, second semiconductor layer 32, light-emitting layer 33, and element electrode layer 37) of the light-emitting element core 30 exposed to the etchant used in the etching process for forming the first stack structure 3000 into the light-emitting element cores 30.

The surface defect occurring on the side face of the light-emitting element core 30 may cause leakage of electrons injected into the semiconductor layer or trapping of holes injected into the semiconductor layer. This may interfere with combinations of electrons and holes, thereby lowering the light efficiency of the light-emitting element ED. Further, in case that the element insulating layer containing oxygen is formed directly on an outer face of the light-emitting element core 30 having the surface defect, oxygen may diffuse from the element insulating layer along a boundary between the element insulating layer and the light-emitting element core 30 into the semiconductor layer, such that the element efficiency and reliability of the light-emitting element ED may be reduced.

Figure 8:
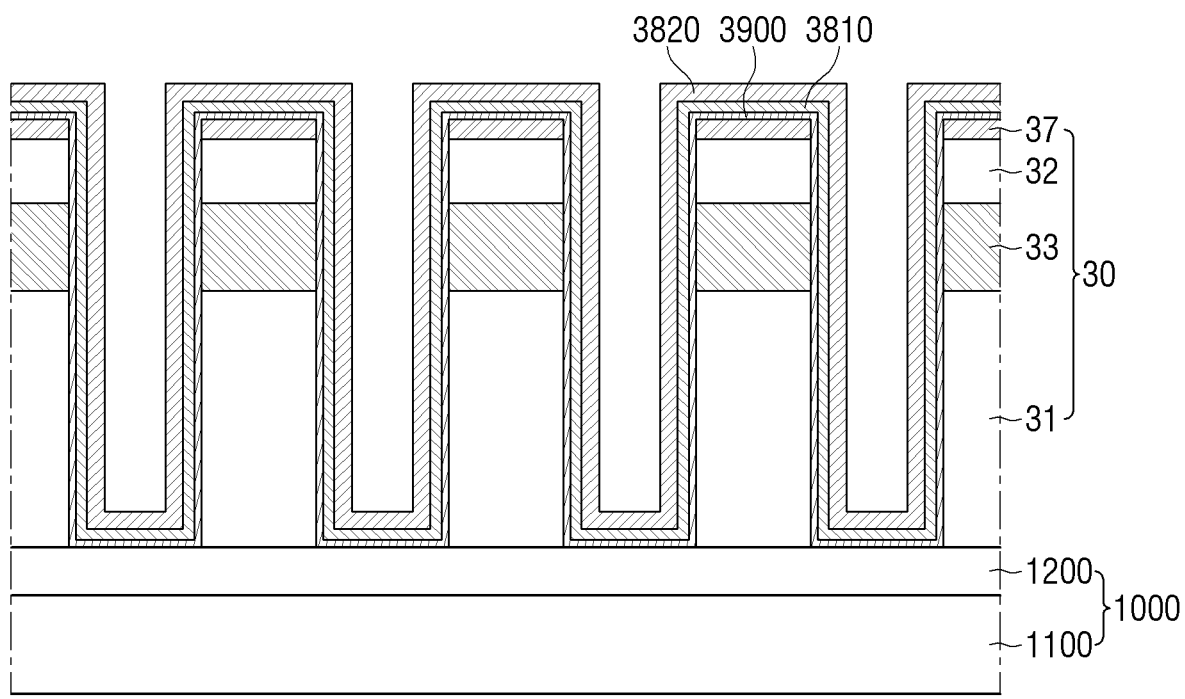
Figure 8:
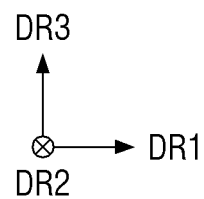

Referring to FIG. 8, a first insulating material layer 3900, a second insulating material layer 3810, and a third insulating material layer 3820 may be sequentially formed on the light-emitting element cores 30.

As described above, in the etching process for forming the light-emitting element core 30, the surface defect may occur on the outer face of the semiconductor layer of the light-emitting element core 30. Thus, in order to prevent the surface defect or to prevent diffusion of impurities or oxygen from the element insulating layer 38, the first insulating material layer 3900 may be formed on the light-emitting element core 30.

The first insulating material layer 3900 may be formed on the light-emitting element cores 30. The first insulating material layer 3900 may be formed over an entirety of the underlying substrate 1000. For example, the first insulating layer 3900 may be formed on the outer face of the light-emitting element core 30 and a portion of the top face of the underlying substrate 1000 exposed through a space between adjacent light-emitting element cores 30. The outer face of the light-emitting element core 30 may include a top face and a side face of the light-emitting element core 30. The first insulating material layer 3900 may be disposed directly on the top face and the side face of the light-emitting element core 30. Therefore, the first insulating material layer 3900 may be disposed directly on and contact the side faces of the semiconductor layers (e.g., first semiconductor layer 31, second semiconductor layer 32, light-emitting layer 33, and element electrode layer 37) of the light-emitting element core 30.

The first insulating material layer 3900 may be changed into the first element insulating film 39 (e.g., refer to FIG. 9) of the light-emitting element ED (e.g., refer to FIG. 9) as described above via a subsequent process. Accordingly, the first insulating material layer 3900 may include a material constituting the first element insulating film 39 (e.g., refer to FIG. 9). For example, the first insulating layer 3900 may include an insulating material containing nitrogen. In an embodiment, the first insulating material layer 3900 may include AlN or SiNx.

The first insulating material layer 3900 may have a predefined thickness to improve efficiency and maintain the reliability of the light-emitting element ED as described above. For example, the first insulating material layer 3900 may have a thickness of about 5 nm or smaller to maintain crystallinity. The thickness of the first insulating material layer 3900 may be in a range of about 1 nm to about 5 nm. For example, the thickness of the first insulating layer 3900 may be in a range of about 2 nm to about 3 nm.

For example, the first insulating material layer 3900 may be formed using atomic layer deposition (ALD), or plasma atomic layer deposition (PEALD). In an embodiment, the first insulating material layer 3900 may be formed using atomic layer deposition (ALD).

The second insulating material layer 3810 and the third insulating material layer 3820 may be sequentially stacked on the first insulating material layer 3900.

For example, the second insulating material layer 3810 may be formed on an outer face of the first insulating material layer 3900. The third insulating material layer 3820 may be formed on an outer face of the second insulating material layer 3810. The first insulating material layer 3900 may be formed on an entirety of the second insulating material layer 3810. The third insulating material layer 3820 may be formed on an entirety of the second insulating material layer 3810.

The second insulating material layer 3810 may be changed into the second element insulating film 381 of the light-emitting element ED via a subsequent process. The third insulating material layer 3820 may be changed into the third element insulating film 382 of the light-emitting element ED via a subsequent process. Therefore, the second insulating material layer 3810 may include a material forming the second element insulating film 381, for example, a material having an energy gap of about 3 electron volts (eV) or greater and a dielectric constant (or permittivity) of about 10 or greater. The material having an energy gap of about 3 electron volts (eV) or greater and a dielectric constant (or permittivity) of about 10 or greater has been exemplified above in describing the second element insulating film 381. Further, the third insulating material layer 3820 may include an insulating material having a dielectric constant smaller than that of the second insulating material layer 3820. A thickness of each of the second insulating material layer 3810 and the third insulating material layer 3820 may be greater than that of the first insulating material layer 3900.

For example, each of the second insulating material layer 3810 and the third insulating material layer 3820 may be formed using atomic layer deposition (ALD), chemical vapor deposition (CVD), or plasma atomic layer deposition (PEALD).

Figure 9:
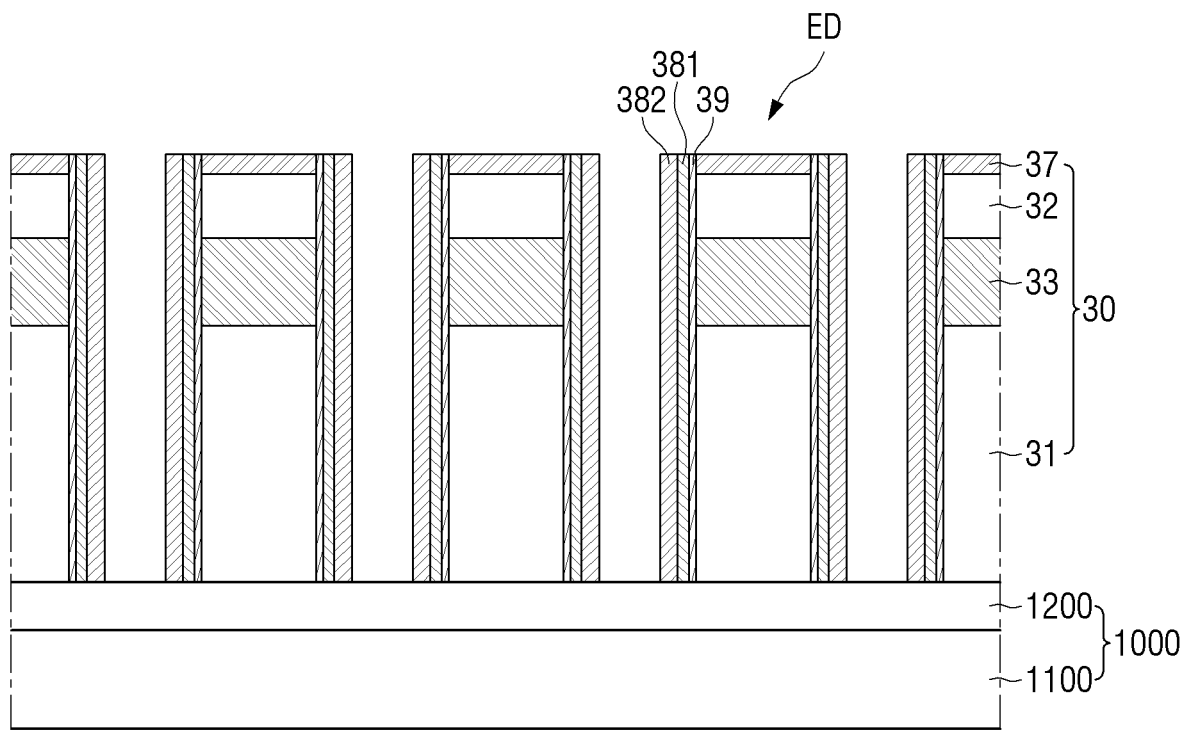
Figure 9:
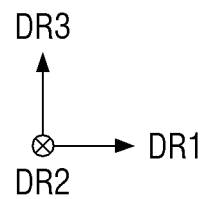

Referring to FIG. 9, the method may include partially removing the first insulating material layer 3900, the second insulating material layer 3810 and the third insulating material layer 3820 to respectively form the first element insulating film 39, the second element insulating film 381, and the third element insulating film 382 surrounding the side face of the light-emitting element core 30.

A process of forming the first element insulating film 39, the second element insulating film 381, and the third element insulating film 382 may include an etching process to partially remove the first insulating material layer 3900, the second insulating material layer 3810, and the third insulating material layer 3820 so that an end face (e.g., a top face of the element electrode layer 37) of the light-emitting element core 30 may be exposed. The process of partially removing the first insulating material layer 3900, the second insulating material layer 3810, and the third insulating material layer 3820 may be performed via an anisotropic etching process such as dry etching or etch back.

Figure 10:
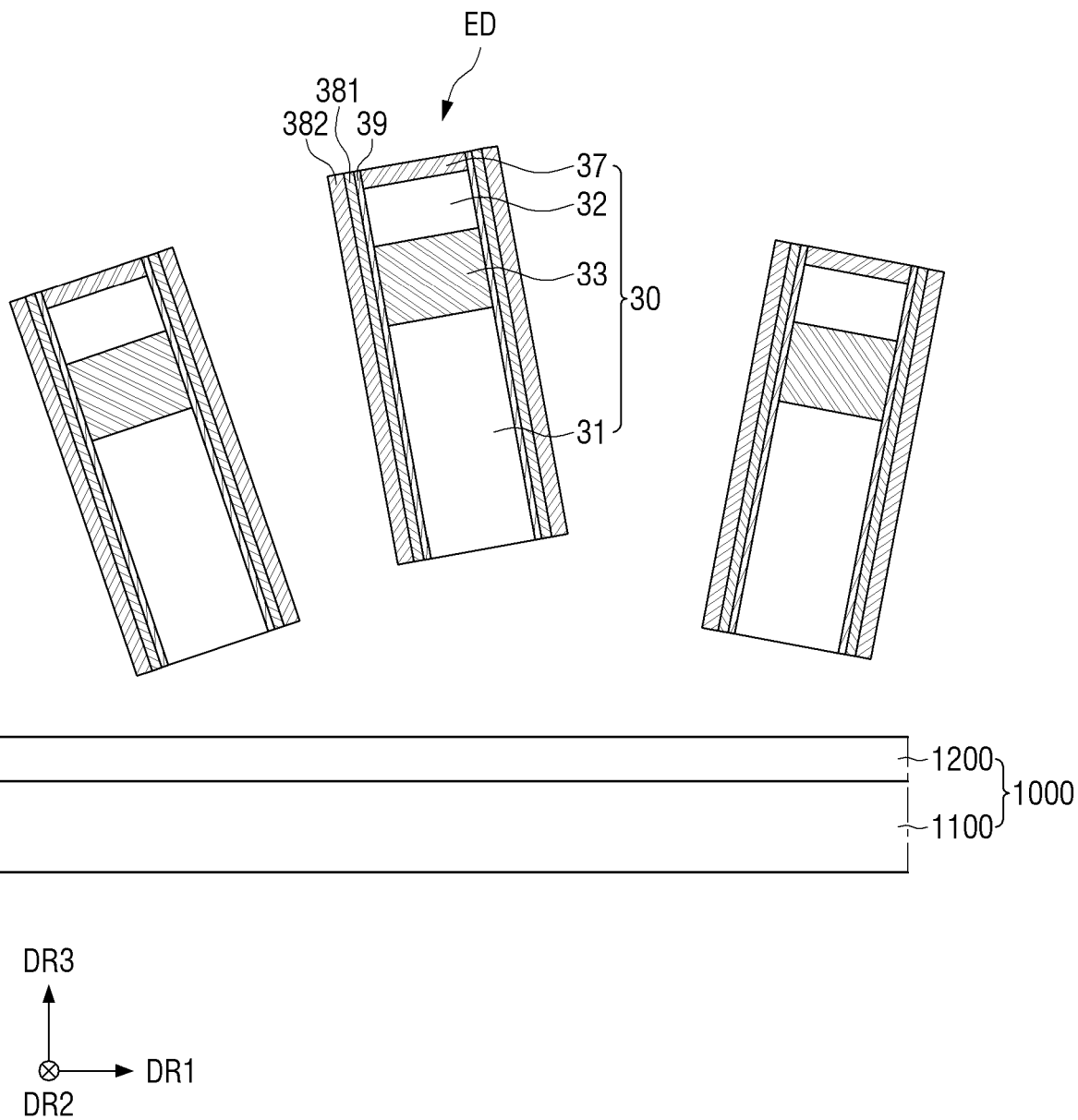

Referring to FIG. 10, the light-emitting elements ED may be removed from the underlying substrate 1000. For example, the process of removing the light-emitting elements ED from the underlying substrate 1000 may not be limited. For example, the process of removing the light-emitting element ED may be performed using a physical removing method or a chemical removing method.

Figure 11:
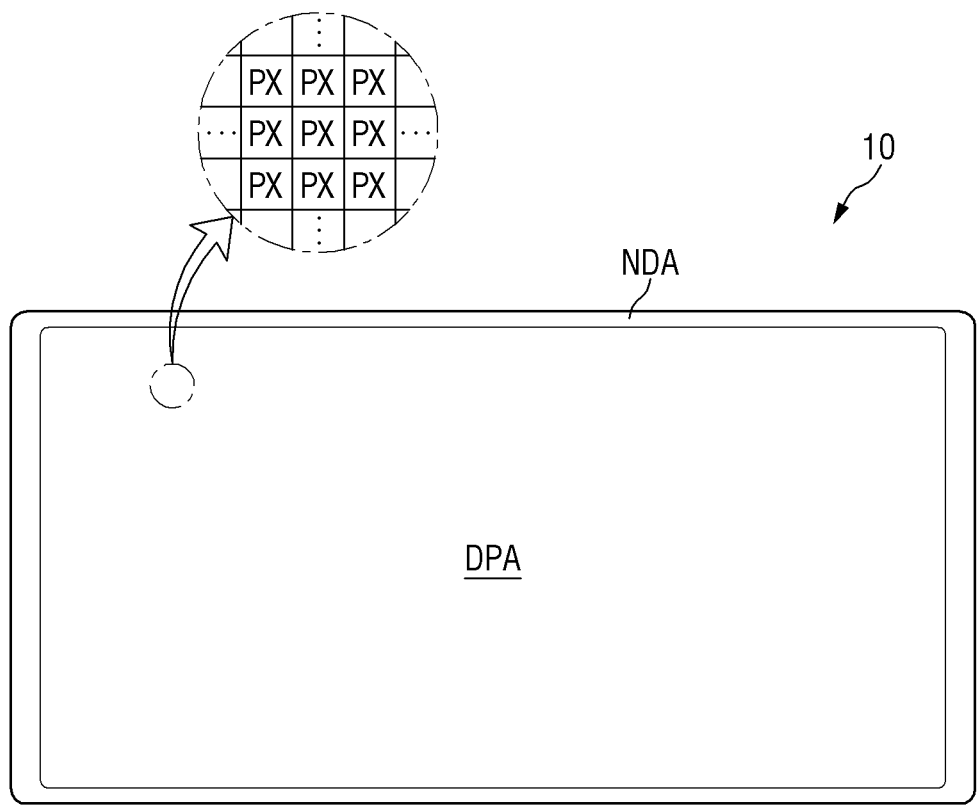
FIG. 11 is a schematic plan view of a display device according to an embodiment.

FIG. 11 is a schematic plan view of a display device according to an embodiment.

Referring to FIG. 11, a display device 10 may display a video or a still image. The display device 10 may refer to any electronic device that provides a display screen. For example, the display device 10 may include a television, a laptop, a monitor, a billboard, Internet of Thing, a mobile phone, a smart phone, a tablet PC, an electronic watch, a smart watch, a watch phone, a head mounted display, a mobile communication terminal, an electronic notebook, an e-book, PMP (Portable Multimedia Player), a navigation, a game console, a digital camera, a camcorder, or the like, which provides a display screen.

The display device 10 may include a display panel that provides a display screen. An example of the display panel may include an inorganic light-emitting diode display panel, an organic light-emitting display panel, a quantum dot light-emitting display panel, a plasma display panel, and a field emission display panel. Hereinafter, an example in which the display panel is embodied as the above-described light-emitting element ED, specifically, the inorganic light-emitting diode display panel will be described. However, the disclosure is not limited thereto. The same technical idea which is applied to the above-described light-emitting element ED, specifically, the inorganic light-emitting diode display panel may be applied to other display panels.

Hereinafter, a fourth direction DR4, a fifth direction DR5, and a sixth direction DR6 are defined in the drawing of the embodiment for illustrating the display device 10. The fourth direction DR4 and the fifth direction DR5 may form (constitute) a plane and may be perpendicular to each other in the plane. The sixth direction DR6 may be a direction normal to the plane defined by the fourth direction DR4 and the fifth direction DR5. The sixth direction DR6 may be perpendicular to each of the fourth direction DR4 and the fifth direction DR5. In an embodiment for describing the display device 10, the sixth direction DR6 may indicate a thickness direction of the display device 10.

The display device 10 may have a rectangular shape including a long side extending in the fourth direction DR4 and a short side extending in the fifth direction DR5 in a plan view. A corner where the long side and the short side of the display device 10 meet each other may have a right angle on a plan view. However, the disclosure is not limited thereto. The corner of the display device 10 may have a round shape. The planar shape of the display device 10 may not be limited to the illustrated one, and may have other shapes such as a square, a rectangle with rounded corners, other polygons, and a circle.

A display face of the display device 10 may be disposed on a side in the sixth direction DR6 (e.g., thickness direction of display device 10). In embodiments for describing the display device 10, a "top" indicates a side in the sixth direction DR6 (e.g., the display direction of display device 10), and a "top face" refers to a surface facing toward a side in the sixth direction DR6 unless otherwise stated. Further, a "bottom" refers to an opposite side in the sixth direction DR6 (e.g., the opposite direction to the display direction), and a "bottom face" refers to a surface facing toward the opposite side in the sixth direction DR6. Further, "left", "right", "upper", and "lower" indicate directions of the display device 10 in a plan view. For example, "right" indicates a side in the fourth direction DR4, "left" indicates an opposite side in the fourth direction DR4, "upper" indicates a side in the fifth direction DR5, and "lower" indicates an opposite side in the fifth direction DR5.

The display device 10 may include a display area DPA and a non-display area NDA. The display area DPA refers to an area where a screen is displayed, and the non-display area NDA refers to an area where the screen is not displayed.

A planar shape of the display area DPA may correspond to a planar shape of the display device 10. For example, the planar shape of the display area DPA may have a rectangular shape similar to an overall planar shape of the display device 10. The display area DPA may usually occupy an inner region of the display device 10.

The display area DPA may include pixels PX. The pixels PX may be arranged in a matrix form. A planar shape of each pixel PX may be a rectangle or a square. However, the disclosure is not limited thereto. The planar shape of each pixel PX may be a rhombus shape in which each side is inclined with respect to a direction. The pixels PX may be alternately arranged in a stripe type or a pentile type.

The non-display area NDA may be disposed around the display area DPA. The non-display area NDA may entirely or partially surround the display area DPA. In an embodiment, the display area DPA may have a rectangular shape, and the non-display area NDA may have four portions respectively adjacent to four sides of the display area DPA. The non-display area NDA may constitute a bezel of the display device 10. In the non-display area NDA, lines and circuit drivers of the display device 10, or a pad on which an external device is mounted may be disposed.

Figure 12:
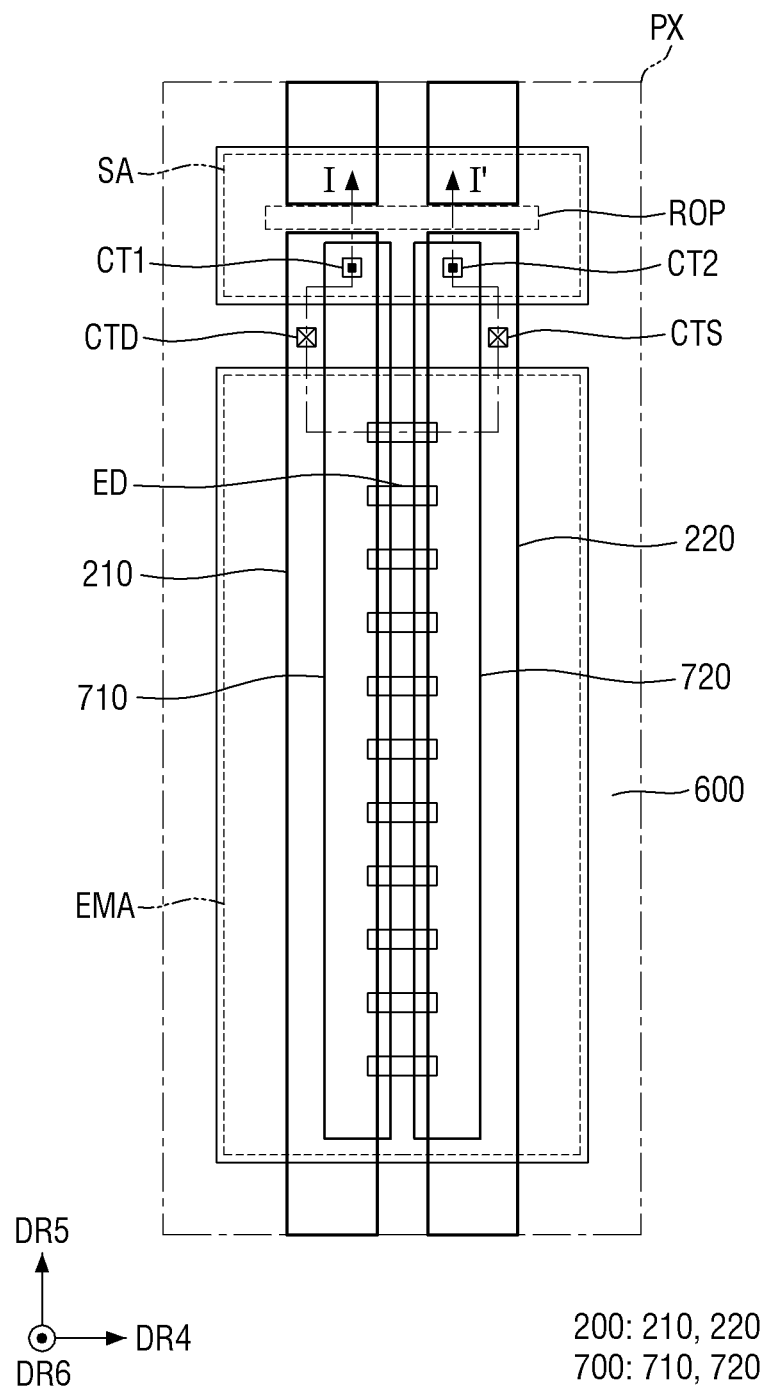
FIG. 12 is a schematic plan layout diagram showing a pixel of a display device according to an embodiment.
Figure 13:
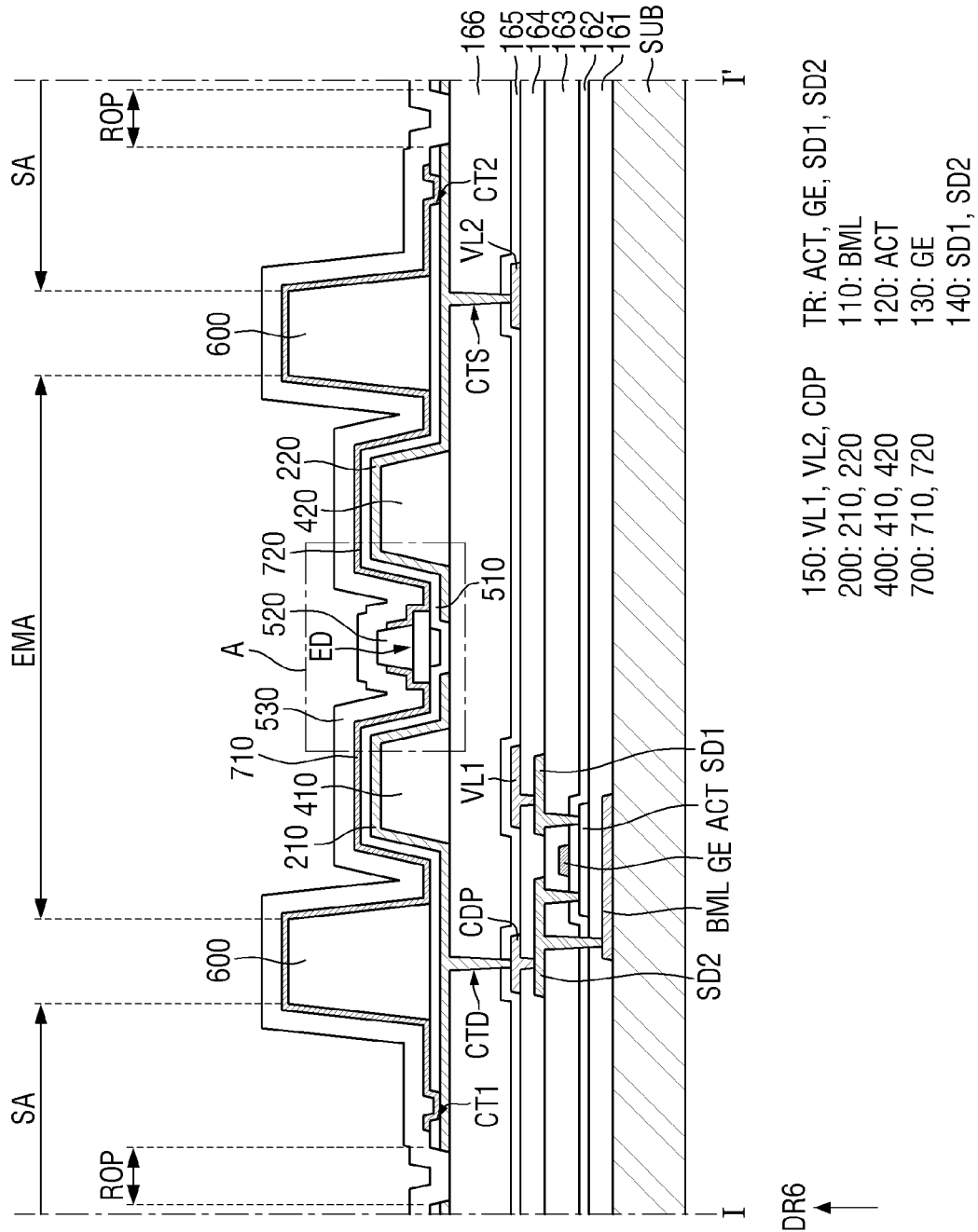
FIG. 13 is a schematic cross-sectional view showing an example cut along line I-I' in FIG. 12.

FIG. 12 is a schematic plan layout diagram showing a pixel of a display device according to an embodiment. FIG. 13 is a schematic cross-sectional view showing an example cut along line I-I' in FIG. 12.

Referring to FIG. 12, each pixel PX of the display device 10 (e.g., refer to FIG. 11) may include a light-emitting area EMA and a non-light-emitting area. The light-emitting area EMA refers to an area from which light emitted from the light-emitting element ED is outputted. The non-light-emitting area may be defined as an area which the light emitted from the light-emitting element ED does not reach and thus does not output the light.

The light-emitting area EMA may include an area in which the light-emitting element ED is disposed, and an area adjacent thereto. Further, the light emitted from the light-emitting element ED may be reflected from or refracted at another member, and the light (e.g., light reflected from or refracted by another member) may emit through an area of the light-emitting area EMA.

Each pixel PX may further include a sub-area SA disposed in the non-light-emitting area. The light-emitting element ED may not be disposed in a sub-area SA. The sub-area SA may be disposed above the light-emitting area EMA and within a pixel PX in a plan view. The sub-area SA may be disposed between light-emitting areas EMA of pixels PX disposed adjacent to each other in the fifth direction DR5. The sub-area SA may include an area where an electrode layer 200 and a contact electrode 700 are electrically connected to each other via contacts CT1 and CT2.

The sub-area SA may include a separation portion ROP. The separation portion ROP of the sub-area SA may respectively separate a first electrode 210 and a second electrode 220 of the electrode layer 200 included in a first pixel PX from a first electrode 210 and a second electrode 220 of the electrode layer 200 included in a second pixel PX adjacent to the first pixel PX in the fifth direction DR5. For example, lower portions of the first and second electrodes 210 and 220 of the second pixel PX (e.g., refer to FIG. 12) may overlap an upper portion of the first pixel PX in a plan view.

Referring to FIGS. 12 and 13, the display device 10 may include a substrate SUB, a circuit element layer disposed on the substrate SUB, and a light-emitting element layer disposed on the circuit element layer.

The substrate SUB may be embodied as an insulating substrate. The substrate SUB may be made of an insulating material such as glass, quartz, or polymer resin. The substrate SUB may be embodied as a rigid substrate, or may be embodied as a flexible substrate which is bendable, foldable, or rollable.

The circuit element layer may be disposed on the substrate SUB. The circuit element layer may include an underlying metal layer 110, a semiconductor layer 120, a first conductive layer 130, a second conductive layer 140, a third conductive layer 150, and insulating films.

The underlying metal layer 110 may be disposed on the substrate SUB. The underlying metal layer 110 may include a light-blocking pattern BML. The light-blocking pattern BML may cover (or overlap) a channel area of an active layer ACT of a transistor TR disposed above the light-blocking pattern BML. However, the disclosure is not limited thereto. The light-blocking pattern BML may be omitted.

The underlying metal layer 110 may include a material that blocks light. For example, the underlying metal layer 110 may be made of (or include) an opaque metal material that disables (or blocks) light transmission.

A buffer layer 161 may be disposed on the underlying metal layer 110. The buffer layer 161 may cover an entirety of the substrate SUB on which the underlying metal layer 110 is disposed. The buffer layer 161 may protect transistors TR from moisture invading the substrate SUB which is vulnerable to moisture permeation.

The semiconductor layer 120 may be disposed on the buffer layer 161. The semiconductor layer 120 may include the active layer ACT of the transistor TR. The active layer ACT of the transistor TR may overlap the light-blocking pattern BML of the underlying metal layer 110 in a plan view as described above.

The semiconductor layer 120 may include polycrystalline silicon, single crystal silicon, oxide semiconductor, or the like. In an embodiment, in case that the semiconductor layer 120 includes polycrystalline silicon, the polycrystalline silicon may be produced by crystallizing amorphous silicon. In case that the semiconductor layer 120 includes polycrystalline silicon, the active layer ACT of the transistor TR may include doped areas doped with impurities and a channel area disposed therebetween. In another embodiment, the semiconductor layer 120 may include the oxide semiconductor. The oxide semiconductor of the semiconductor layer 120 may include, for example, at least one of indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), and the like.

A gate insulating film 162 may be disposed on the semiconductor layer 120. The gate insulating film 162 may function as a gate insulating film for the transistor TR. The gate insulating film 162 may be composed of a stack of multiple layers in which inorganic layers including inorganic materials, for example, at least one of silicon oxide ($SiO_x$), silicon nitride ($SiN_x$), and silicon oxynitride ($SiO_xN_y$) are alternately stacked with each other.

The first conductive layer 130 may be disposed on the gate insulating film 162. The first conductive layer 130 may include a gate electrode GE of the transistor TR. The gate electrode GE may overlap a channel area of the active layer ACT in the sixth direction DR6 (e.g., the thickness direction of the substrate SUB).

A first interlayer insulating film 163 may be disposed on the first conductive layer 130. The first interlayer insulating film 163 may cover the gate electrode GE. The first interlayer insulating film 163 may function as an insulating film between the first conductive layer 130 and other layers (e.g., second conductive layer 140) disposed thereon, and may protect the first conductive layer 130.

The second conductive layer 140 may be disposed on the first interlayer insulating film 163. The second conductive layer 140 may include a drain electrode SD1 of the transistor TR and a source electrode SD2 of the transistor TR.

The drain electrode SD1 and the source electrode SD2 of the transistor TR may be electrically connected to both opposing ends of the active layer ACT of the transistor TR via contact holes extending through the first interlayer insulating film 163 and the gate insulating film 162, respectively. Further, the source electrode SD2 of the transistor TR may be electrically connected to the light-blocking pattern BML of the underlying metal layer 110 via another contact hole extending through the first interlayer insulating film 163, the gate insulating film 162, and the buffer layer 161.

A second interlayer insulating film 164 may be disposed on the second conductive layer 140. The second interlayer insulating film 164 may cover the drain electrode SD1 of the transistor TR and the source electrode SD2 of the transistor TR. The second interlayer insulating film 164 may function as an insulating film between the second conductive layer 140 and other layers (e.g., third conductive layer 150) disposed thereon, and may protect the second conductive layer 140.

The third conductive layer 150 may be disposed on the second interlayer insulating film 164. The third conductive layer 150 may include a first voltage line VL1, a second voltage line VL2, and a conductive pattern CDP.

The first voltage line VL1 may overlap at least a portion of the drain electrode SD1 of the transistor TR in the thickness direction (e.g., sixth direction DR6) of the substrate SUB. A high-potential voltage (or first power voltage) to be supplied to the transistor TR may be applied to the first voltage line VL1. For example, the high-potential voltage (or first power voltage) may be supplied to the transistor TR through the first voltage line VL1.

The second voltage line VL2 may be electrically connected to the second electrode 220 via a second electrode contact hole CTS extending through a via layer 166 and a passivation layer 165 to be described below. A low-potential voltage (or second power voltage) lower than the high-potential voltage supplied to the first voltage line VL1 may be applied to the second voltage line VL2. For example, the high-potential voltage (or first power voltage) to be supplied to the transistor TR may be applied to the first voltage line VL1, and the low-potential voltage (or second power voltage) lower than the high-potential voltage supplied to the first voltage line VL1 may be applied to the second voltage line VL2.

The conductive pattern CDP may be electrically connected to the source electrode SD2 of the transistor TR. The conductive pattern CDP may be electrically connected to the source electrode SD2 of the transistor TR via a contact hole extending through the second interlayer insulating film 164. Further, the conductive pattern CDP may be electrically connected to the first electrode 210 via a first electrode contact hole CTD extending through the via layer 166 and the passivation layer 165 to be described below. The transistor TR may transmit the first power voltage applied from the first voltage line VL1 to the first electrode 210 via the conductive pattern CDP.

The passivation layer 165 may be disposed on the third conductive layer 150 (e.g., first voltage line VL1, second voltage line VL2, conductive pattern CDP, or the like). The passivation layer 165 may cover (or overlap) the third conductive layer 150. The passivation layer 165 may protect the third conductive layer 150.

Each of the buffer layer 161, the gate insulating film 162, the first interlayer insulating film 163, the second interlayer insulating film 164, and the passivation layer 165 as above-described may include inorganic layers which are stacked alternately with each other. For example, each of the buffer layer 161, the gate insulating film 162, the first interlayer insulating film 163, the second interlayer insulating film 164, and the passivation layer 165 as above-described may be composed of a stack in which two inorganic layers including at least one of silicon oxide ($SiO_x$), silicon nitride ($SiN_x$), and silicon oxynitride ($SiO_xN_y$) are stacked, or a stack in which multiple inorganic layers including at least one of silicon oxide ($SiO_x$), silicon nitride ($SiN_x$), and silicon oxynitride ($SiO_xN_y$) are alternately stacked with each other. However, the disclosure is not limited thereto. Each of the buffer layer 161, the gate insulating film 162, the first interlayer insulating film 163, the second interlayer insulating film 164, and the passivation layer 165 as above-described may be composed of a single inorganic layer including the above-described insulating material.

The via layer 166 may be disposed on the passivation layer 165. The via layer 166 may include an organic insulating material, for example, an organic material such as polyimide (PI). The via layer 166 may planarize a surface. Accordingly, a top face or surface of the via layer 166 on which a light-emitting element layer to be described below is disposed may be generally planarized regardless of a shape or presence or absence of a pattern disposed thereunder.

The light-emitting element layer may be disposed on the circuit element layer. The light-emitting element layer may be disposed on the via layer 166. The light-emitting element layer may include a first bank 400, the electrode layer 200, a first insulating layer 510, a second bank 600, light-emitting elements ED, and a contact electrode 700.

The first bank 400 may be disposed on the via layer 166 and in the light-emitting area EMA. The first bank 400 may be disposed directly on a face of the via layer 166. The first bank 400 may have a structure in which at least a portion of the first bank 400 protrudes upwardly (e.g., toward a side in the sixth direction DR6) beyond the face of the via layer 166. The protruding portion of the first bank 400 may have an inclined side face. The first bank 400 may include the inclined side face and change (or guide) a travel direction of the light emitted from the light-emitting element ED toward the side face of the first bank 400 in an upward direction (e.g., the display direction or sixth direction DR6).

The first bank 400 may include a first sub-bank 410 and a second sub-bank 420 spaced apart from each other. The first sub-bank 410 and the second sub-bank 420 spaced apart from each other may serve as a reflective partitioning wall which may provide a space therebetween in which the light-emitting element ED is disposed and at the same time, change (or guide) the direction of the light emitted from the light-emitting element ED in the display direction (e.g., sixth direction DR6).

Although the drawing shows that the side face of the first bank 400 is inclined in a linear shape, the disclosure is not limited thereto. For example, the side face (or outer face) of the first bank 400 may have a round shape, a semi-circle shape, or a semi-ellipse shape. In an embodiment, the first bank 400 may include an organic insulating material such as polyimide (PI). However, the disclosure is not limited thereto.

The electrode layer 200 may have a shape extending in a direction and may extend across the light-emitting area EMA and the sub-area SA. The electrode layer 200 may transmit an electrical signal applied from the circuit element layer to the light-emitting element ED such that the light-emitting element ED emits light. Further, the electrode layer 200 may be used to generate an electric field used in a process of uniformly orienting the light-emitting elements ED during manufacturing process the display device 10 (e.g., refer to FIG. 11).

The electrode layer 200 may be disposed on the first bank 400 and a portion of the via layer 166 as not covered with the first bank 400. In the light-emitting area EMA, the electrode layer 200 may be disposed on the first bank 400, and in the non-light-emitting area, the electrode layer 200 may be disposed on the portion of the via layer 166, which is not covered with the first bank 400.

The electrode layer 200 may include the first electrode 210 and the second electrode 220. The first electrode 210 and the second electrode 220 may be spaced apart from each other.

The first electrode 210 may be disposed on a left side of each pixel PX in a plan view. The first electrode 210 may have a shape extending in the fifth direction DR5 in a plan view. The first electrode 210 may extend across the light-emitting area EMA and the sub-area SA. The first electrode 210 may extend in the fifth direction DR5 in a plan view, and may be separated from a first electrode 210 of a pixel PX neighboring to each pixel PX in the fifth direction DR5 by the separation portion ROP of the sub-area SA.

The second electrode 220 may be spaced apart from the first electrode 210 in the fourth direction DR4. The second electrode 220 may be disposed at a right side of each pixel PX in a plan view. The second electrode 220 may have a shape extending in the fifth direction DR5 in a plan view. The second electrode 220 may extend across the light-emitting area EMA and the sub-area SA. The second electrode 220 may extend in the fifth direction DR5 in a plan view, and may be separated from a second electrode 220 of a pixel PX neighboring to each pixel PX in the fifth direction DR5 by the separation portion ROP of the sub-area SA.

For example, in the light-emitting area EMA, the first electrode 210 may be disposed on the first sub-bank 410, and the second electrode 220 may be disposed on the second sub-bank 420. The first electrode 210 may extend outwardly from the first sub-bank 410 and may be disposed on a portion of the via layer 166, which is not covered with the first sub-bank 410. Similarly, the second electrode 220 may extend outwardly from the second sub-bank 420 and be disposed on a portion of the via layer 166, which is not covered with the second sub-bank 420. A portion of the first electrode 210 and a portion of the second electrode 220 may face toward each other and may be disposed in a space between the first sub-bank 410 and the second sub-bank 420. A portion of the via layer 166 in an area where the first electrode 210 and the second electrode 220 are spaced apart from each other and face toward each other may be exposed. For example, the via layer 166 may be partially exposed between the first electrode 210 and the second electrode 220.

The first electrode 210 may be spaced apart from the adjacent first electrode 210 of another pixel PX adjacent to the pixel PX in the fifth direction DR5, and the separation portion ROP in the sub-area SA may be interposed therebetween. Similarly, the second electrode 220 may be spaced apart from a second electrode 220 of another pixel PX adjacent to the pixel PX in the fifth direction DR5, and the separation portion ROP in the sub-area SA may be interposed therebetween. Accordingly, in an area of the separation portion ROP in the sub-area SA, the first electrode 210 and the second electrode 220 may not cover the via layer 166 and may expose the portion of the via layer 166.

The first electrode 210 may be electrically connected to the conductive pattern CDP of the circuit element layer via the first electrode contact hole CTD extending through the via layer 166 and the passivation layer 165. For example, the first electrode 210 may contact a portion of a top face of the conductive pattern CDP, which is exposed through the first electrode contact hole CTD. The first power voltage applied from the first voltage line VL1 may be transmitted to the first electrode 210 via the conductive pattern CDP.

The second electrode 220 may be electrically connected to the second voltage line VL2 of the circuit element layer via the second electrode contact hole CTS extending through the via layer 166 and the passivation layer 165. For example, the second electrode 220 may contact a portion of a top face of the second voltage line VL2, which is exposed through the second electrode contact hole CTS. The second power voltage applied from the second voltage line VL2 may be transferred to the second electrode 220.

The electrode layer 200 may include a highly reflective conductive material. For example, the electrode layer 200 may include a metal such as silver (Ag), copper (Cu), or aluminum (Al) as a material having high reflectivity or an alloy including aluminum (Al), nickel (Ni), lanthanum (La), and the like. The electrode layer 200 may reflect light emitted from the light-emitting element ED and traveling toward the side face of the first bank 400 toward a top of each pixel PX.

However, the disclosure is not limited thereto. The electrode layer 200 may further include a transparent conductive material. For example, the electrode layer 200 may include a material such as ITO (Indium Tin Oxide), IZO (Indium Zinc Oxide), ITZO (Indium Tin-Zinc Oxide), or the like. In some embodiments, the electrode layer 200 may have a structure in which at least one layer made of a transparent conductive material and at least one layer made of a metal having high reflectivity are stacked one on top of another, or may be composed of a single layer including the transparent conductive material and the metal having high reflectivity. For example, the electrode layer 200 may have a stack structure such as ITO/Ag/ITO, ITO/Ag/IZO, or ITO/Ag/ITZO/IZO.

The first insulating layer 510 may be disposed on the via layer 166 on which the electrode layer 200 is formed. The first insulating layer 510 may protect the electrode layer 200 and electrically insulate the first electrode 210 and the second electrode 220 from each other.

The first insulating layer 510 may include an inorganic insulating material. For example, the first insulating layer 510 may include at least one of inorganic insulating materials such as silicon oxide ($SiO_x$), silicon nitride ($SiN_x$), silicon oxynitride ($SiO_xN_y$), aluminum oxide ($Al_xO_y$), and aluminum nitride (AlN). The first insulating layer 510 made of the inorganic material may have a surface shape corresponding to a pattern shape of the electrode layer 200 disposed thereunder. For example, the first insulating layer 510 may have a step structure (or height difference) according to a shape of the electrode layer 200 disposed under the first insulating layer 510. For example, the first insulating layer 510 may include a step structure in which a portion of a top face thereof is depressed (or recessed) in the space area between the first electrode 210 and the second electrode 220. Accordingly, a vertical level of a top face of the first insulating layer 510 disposed on top faces of the first electrode 210 and the second electrode 220 may be higher than a vertical level of a top face of the first insulating layer 510 disposed on a top face of a portion of the via layer 166 on which the first electrode 210 and the second electrode 220 are not disposed. As used herein, a vertical level of a top face of a layer may be measured based on a planarized reference face (e.g., a top face of the via layer 166) free of a step structure.

The first insulating layer 510 may include a first contact CT1 exposing a portion of a top face of the first electrode 210 and disposed in the sub-area SA, and a second contact CT2 exposing a portion of a top face of the second electrode 220 and disposed in the sub-area SA. The first electrode 210 may be electrically connected to a first contact electrode 710 to be described below via the first contact CT1 extending through the first insulating layer 510 and disposed in the sub-area SA. The second electrode 220 may be electrically connected to a second contact electrode 720 to be described below via the second contact CT2 extending through the first insulating layer 510 and disposed in the sub-area SA.

The second bank 600 may be disposed on the first insulating layer 510. The second bank 600 may include portions arranged in the fourth direction DR4 and the fifth direction DR5 and in a grid pattern in a plan view.

The second bank 600 may be disposed along and at a boundary between the pixels PX to distinguish neighboring pixels PX from each other. Further, the second bank 600 may distinguish the light-emitting area EMA and the sub-area SA from each other. Further, the second bank 600 may have a vertical dimension (or height) greater than that of the first bank 400, thereby preventing ink containing the light-emitting elements ED dispersed therein from flowing into an adjacent pixel PX, and the ink may remain in the light-emitting area EMA in an inkjet printing process (e.g., uniformly orienting the light-emitting elements ED) during the manufacturing process of the display device 10.

The light-emitting elements ED may be disposed in the light-emitting area EMA. The light-emitting elements ED may not be disposed in the sub-area SA.

The light-emitting elements ED may be disposed on the first insulating layer 510 and between the first sub-bank 410 and the second sub-bank 420. The light-emitting elements ED may be disposed between the first electrode 210 and the second electrode 220 and on the first insulating layer 510.

The light-emitting element ED may have a shape extending in a direction (e.g., fourth direction DR4 of FIG. 12). The light-emitting element ED may be oriented such that both opposing ends thereof are disposed on the first electrode 210 and the second electrode 220, respectively. For example, the light-emitting element ED may be arranged such that one end of each of the light-emitting elements ED may be disposed on the first electrode 210 and the opposite end of each of the light-emitting elements ED may be disposed on the second electrode 220.

A length of each light-emitting element ED (e.g., length of light-emitting element ED in the fourth direction DR4) in the drawing may be smaller than the shortest spacing (or distance) between the first sub-bank 410 and the second sub-bank 420 spaced apart from each other in the fourth direction DR4. Further, the length of each light-emitting element ED may be greater than the shortest spacing between the first electrode 210 and the second electrode 220 spaced apart from each other in the fourth direction DR4. A spacing in the fourth direction DR4 between the first sub-bank 410 and the second sub-bank 420 may be greater than the length of each light-emitting element ED. The spacing (or distance) in the fourth direction DR4 between the first electrode 210 and the second electrode 220 may be smaller than the length of each light-emitting element ED. Thus, the light-emitting elements ED may be disposed in an area between the first sub-bank 410 and the second sub-bank 420, and the opposing ends of each of the light emitting elements may be disposed on the first electrode 210 and the second electrode 220, respectively.

The light-emitting elements ED may be spaced apart from each other in the fifth direction DR5 in which the first electrode 210 and the second electrode 220 extend, and may be oriented in a substantially parallel manner to each other.

The second insulating layer 520 may be disposed on the light-emitting element ED. The second insulating layer 520 may be partially disposed on the light-emitting element ED so as to expose both opposing ends of the light-emitting element ED. The second insulating layer 520 may partially surround an outer face of the light-emitting element ED, so that one end and the opposite end of the light-emitting element ED are not covered (or overlapped) therewith.

In a plan view, a portion of the second insulating layer 520 disposed on the light-emitting element ED may extend in the fifth direction DR5 and be disposed on the first insulating layer 510, and thus may constitute a linear or island-like pattern within each pixel PX. The second insulating layer 520 may protect the light-emitting element ED and fix the light-emitting element ED in the manufacturing process of the display device 10. Further, the second insulating layer 520 may fill a space between the light-emitting element ED and the first insulating layer 510 disposed thereunder.

The contact electrode 700 may be disposed on the second insulating layer 520. The contact electrode 700 may be disposed on the first insulating layer 510 on which the light-emitting element ED is disposed. The contact electrode 700 may include the first contact electrode 710 and the second contact electrode 720 spaced apart from each other.

The first contact electrode 710 may be disposed on the first electrode 210 and in the light-emitting area EMA. The first contact electrode 710 disposed on the first electrode 210 may have a shape extending in the fifth direction DR5. The first contact electrode 710 may contact the first electrode 210 and an end of the light-emitting element ED.

The first contact electrode 710 may be in contact with the first electrode 210 via the first contact CT1 extending through the first insulating layer 510 and disposed in the sub-area SA. In the light-emitting area EMA, the first contact electrode 710 may contact one end of the light-emitting element ED. For example, the first contact electrode 710 may electrically connect the first electrode 210 and one end of the light-emitting element ED to each other.

The second contact electrode 720 may be disposed on the second electrode 220 and in the light-emitting area EMA. The second contact electrode 720 disposed on the second electrode 220 may have a shape extending in the fifth direction DR5. The second contact electrode 720 may contact the second electrode 220 and the opposite end of the light-emitting element ED.

The second contact electrode 720 may contact the second electrode 220 via the second contact CT2 extending through the first insulating layer 510 and disposed in the sub-area SA. In the light-emitting area EMA, the second contact electrode 720 may contact the opposite end of the light-emitting element ED. For example, the second contact electrode 720 may electrically connect the second electrode 220 and the opposite end of the light-emitting element ED to each other.

The first contact electrode 710 and the second contact electrode 720 may be spaced apart from each other and disposed on the light-emitting element ED. For example, the first contact electrode 710 and the second contact electrode 720 may be spaced apart from each other, and the second insulating layer 520 may be disposed therebetween. The first contact electrode 710 and the second contact electrode 720 may be electrically insulated from each other.

The first contact electrode 710 and the second contact electrode 720 may include a same material. For example, each of the first contact electrode 710 and the second contact electrode 720 may include a conductive material. For example, each of the first contact electrode 710 and the second contact electrode 720 may include at least one of ITO, IZO, ITZO, aluminum (Al), and the like. In an example, each of the first contact electrode 710 and the second contact electrode 720 may include a transparent conductive material. In case that each of the first contact electrode 710 and the second contact electrode 720 is made of the transparent conductive material, the light emitted from the light-emitting element ED may pass through the first contact electrode 710 and the second contact electrode 720 and then may proceed toward the first electrode 210 and the second electrode 220, and then may be reflected from a surface of each of the first electrode 210 and the second electrode 220.

The first contact electrode 710 and the second contact electrode 720 may be made of a same material and may constitute a same layer. The first contact electrode 710 and the second contact electrode 720 may be simultaneously formed using a same process.

A third insulating layer 530 may be disposed on the contact electrode 700. The third insulating layer 530 may cover the light-emitting element layer disposed thereunder. The third insulating layer 530 may cover the first bank 400, the electrode layer 200, the first insulating layer 510, the light-emitting elements ED, and the contact electrode 700. The third insulating layer 530 may be disposed on the second bank 600 and cover the second bank 600.

The third insulating layer 530 may protect the light-emitting element layer disposed thereunder from foreign substances such as moisture/oxygen or dust particles. The third insulating layer 530 may protect the first bank 400, the electrode layer 200, the first insulating layer 510, the light-emitting elements ED, and the contact electrode 700.

Figure 14:
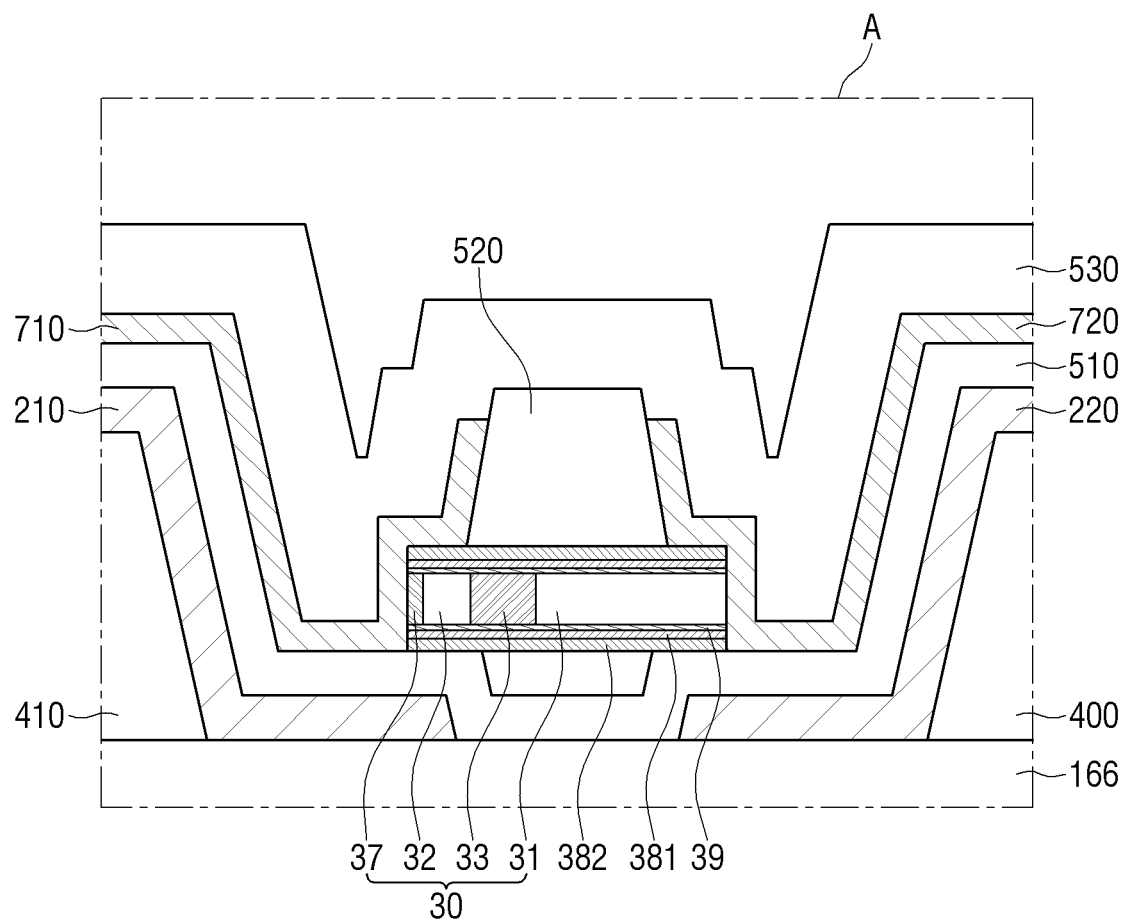
FIG. 14 is a schematic enlarged cross-sectional view showing an example of area A of FIG. 13.

FIG. 14 is a schematic enlarged cross-sectional view showing an example of area A of FIG. 13.

Referring to FIG. 14, the light-emitting element ED may be oriented so that an extending direction of the light-emitting element ED is parallel to a face of the substrate SUB. The semiconductor layers (e.g., first semiconductor layer 31, light-emitting layer 33, and second semiconductor layer 32) included in the light-emitting element ED may be sequentially arranged in a direction parallel to the top face of the substrate SUB or the top face of the via layer 166. For example, the first semiconductor layer 31, the light-emitting layer 33, and the second semiconductor layer 32 of the light-emitting element ED may be sequentially arranged in a direction parallel to the top face of the substrate SUB.

For example, in a cross-sectional view across both opposing ends of the light-emitting element ED, the first semiconductor layer 31, the light-emitting layer 33, the second semiconductor layer 32, and the element electrode layer 37 may be arranged sequentially in a direction parallel to a top face of the substrate SUB.

The light-emitting element ED may be oriented such that one end thereof is disposed on the first electrode 210 and the opposite end thereof is disposed on the second electrode 220. However, the disclosure is not limited thereto. The light-emitting element ED may be oriented such that one end thereof is disposed on the second electrode 220, and the opposite end thereof is disposed on the first electrode 210.

The second insulating layer 520 may be disposed on the light-emitting element ED. The second insulating layer 520 may surround an outer face of the light-emitting element ED. The second insulating layer 520 may be disposed on the third element insulating film 382 of the light-emitting element ED, and may surround an outer side face of the third element insulating film 382 of the light-emitting element ED facing in the display direction DR6. For example, the second insulating layer 520 may surround an upper face (e.g., outer side face) of the third element insulating film 382 of the light-emitting element ED.

In an area where the light-emitting element ED is disposed, the second insulating layer 520 may surround an outer face of the light-emitting element ED, specifically, surround the third element insulating film 382 of the light-emitting element ED. In an area where the light-emitting element ED is not disposed, the second insulating layer 520 may be disposed on a portion of the first insulating layer 510, which is not covered with the light-emitting element ED.

The first contact electrode 710 may contact one end of the light-emitting element ED, which is not covered with the second insulating layer 520. For example, the first contact electrode 710 may surround one end face of the light-emitting element ED, which is not covered with the second insulating layer 520. The first contact electrode 710 may contact the element insulating layer 38 and the element electrode layer 37 of the light-emitting element ED.

The second contact electrode 720 may contact the opposite end of the light-emitting element ED, which is not covered with the second insulating layer 520. For example, the second contact electrode 720 may surround the opposite end face of the light-emitting element ED, which is not covered with the second insulating layer 520. The second contact electrode 720 may contact the element insulating layer 38 and the first semiconductor layer 31 of the light-emitting element ED.

The first contact electrode 710 and the second contact electrode 720 may be spaced apart from each other, and the second insulating layer 520 may be interposed therebetween. The first contact electrode 710 and the second contact electrode 720 may expose at least a portion of the top face of the second insulating layer 520.

The first contact electrode 710 and the second contact electrode 720 may constitute a same layer, and may include a same material. For example, the first contact electrode 710 and the second contact electrode 720 may be simultaneously formed using a mask process. Accordingly, because an additional mask process for forming the first contact electrode 710 and the second contact electrode 720 is not required, efficiency of the manufacturing process of the display device 10 may be improved.

Figure 15:
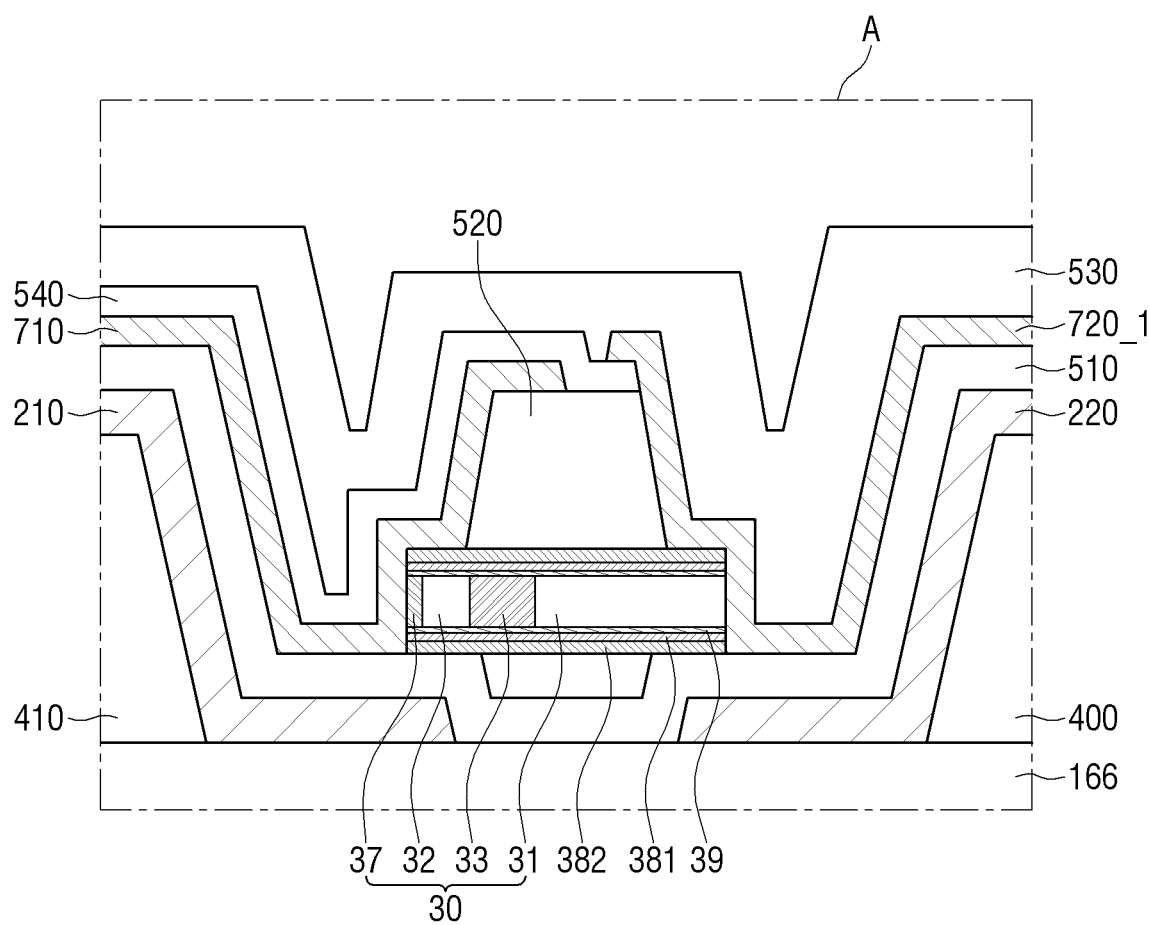
FIG. 15 is a schematic enlarged cross-sectional view showing another example of area A of FIG. 13.

FIG. 15 is a schematic enlarged cross-sectional view showing another example of area A of FIG. 13.

Referring to FIG. 15, the display device 10 according to this embodiment may be different from the embodiment in FIG. 14 at least in that a contact electrode 700_1 includes a first contact electrode 710 and a second contact electrode 720_1 respectively constituting different layers and the display device 10 further includes a fourth insulating layer 540.

For example, the contact electrode 700_1 may include the first contact electrode 710 and the second contact electrode 720_1 respectively constituting different layers.

The first contact electrode 710 may be disposed on a first electrode 210 and an end of a light-emitting element ED. The first contact electrode 710 may extend from the end of the light-emitting element ED toward a second insulating layer 520 and thus may be further disposed on a sidewall of the second insulating layer 520 and a top face of the second insulating layer 520. The first contact electrode 710 may be disposed on the top face of the second insulating layer 520 such that at least a portion of the top face of the second insulating layer 520 may be exposed.

The fourth insulating layer 540 may be disposed on the first contact electrode 710. The fourth insulating layer 540 may cover (or overlap) an entirety of the first contact electrode 710. The fourth insulating layer 540 may cover an entirety of a sidewall and an entirety of the top face of the second insulating layer 520. However, the fourth insulating layer 540 may not be disposed on an opposite sidewall of the second insulating layer 520. An end of the fourth insulating layer 540 may be aligned with the other sidewall of the second insulating layer 520.

The second contact electrode 720_1 may be disposed on a second electrode 220 and an opposite end of the light-emitting element ED. The second contact electrode 720_1 may extend from the opposite end of the light-emitting element ED toward the second insulating layer 520 and thus may be further disposed on the opposite sidewall of the second insulating layer 520 and the top face of the fourth insulating layer 540.

A third insulating layer 530 may be disposed on the fourth insulating layer 540 and the second contact electrode 720_1. The third insulating layer 530 may be disposed on the fourth insulating layer 540 and the second contact electrode 720_1 and cover (or overlap) the fourth insulating layer 540 and the second contact electrode 720_1.

In this embodiment, forming the first contact electrode 710 and the second contact electrode 720_1 respectively constituting different layers, and interposing the fourth insulating layer 540 therebetween may require an additional process of the display device 10 and thus lower the efficiency of the manufacturing process of the display device 10, but may allow the reliability of the display device 10 to be improved. Specifically, forming the first contact electrode 710 and the second contact electrode 720_1 respectively constituting different layers, and interposing the fourth insulating layer 540 therebetween may allow probability of a short-circuit between the first contact electrode 710 and the second contact electrode 720_1 to minimized in the manufacturing process of the display device 10.

Figure 16:
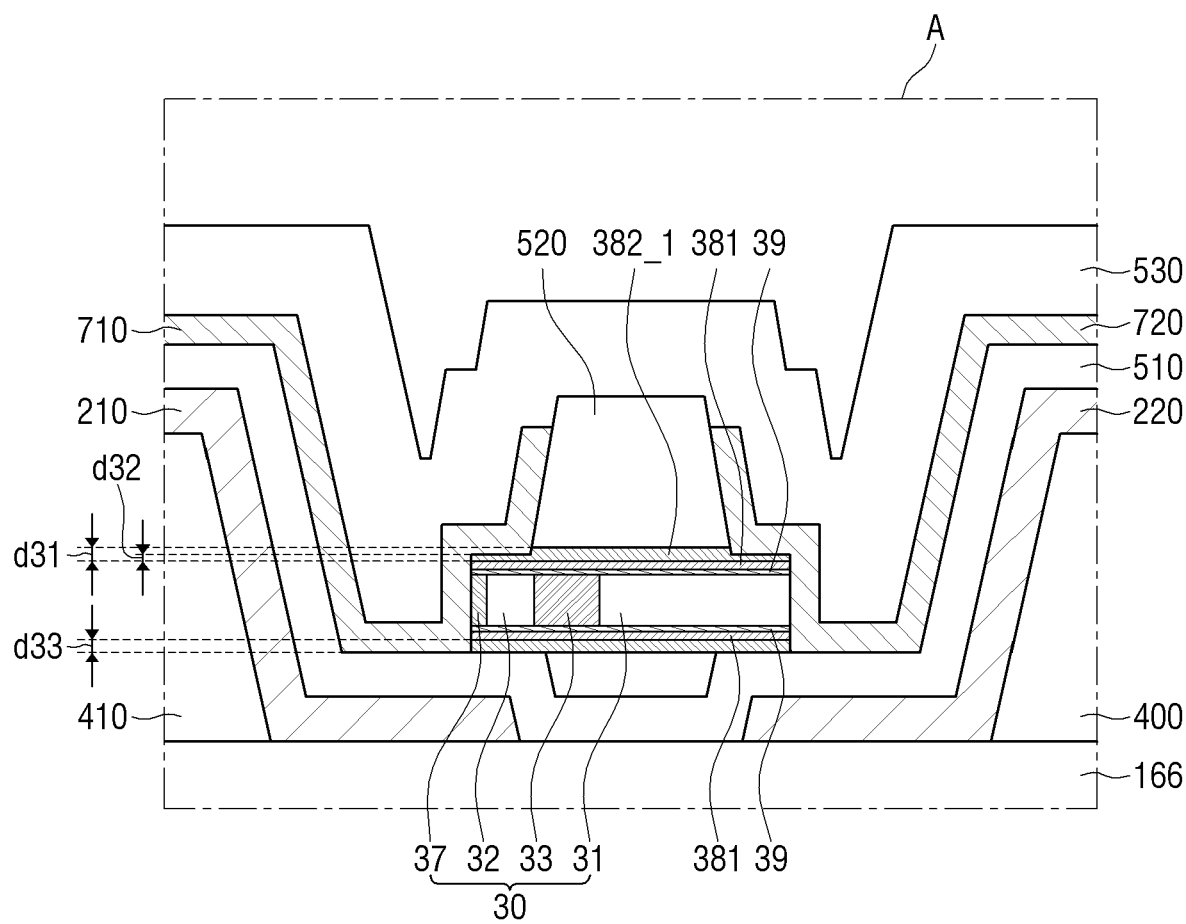
FIG. 16 is a schematic enlarged cross-sectional view showing still another example of area A of FIG. 13.

FIG. 16 is a schematic enlarged cross-sectional view showing still another example of area A of FIG. 13.

Referring to FIG. 16, a display device 10 according to this embodiment differs from the embodiment in FIG. 14 at least in that a thickness of a third element insulating film 382_1 of the light-emitting element ED facing in the display direction varies based on areas thereof.

For example, the third element insulating film 382_1 of the light-emitting element ED disposed between the first electrode 210 and the second electrode 220 may have a thickness varying based on areas thereof. In a cross-sectional view across the light-emitting element ED, the third element insulating film 382_1 located above the light-emitting element core 30 has a first thickness d31 in an area thereof overlapping the second insulating layer 520 (e.g., in a plan view). In a cross-sectional view across the light-emitting element ED, the third element insulating film 382_1 located above the light-emitting element core 30 may have a second thickness d32 smaller than and the first thickness d31 in an area thereof non-overlapping the second insulating layer 520. In a cross-sectional view across the light-emitting element ED, the third element insulating film 382_1 positioned below the light-emitting element core 30 may have a third thickness d33 equal to the first thickness d31. A portion of the third element insulating film 382_1 positioned above the light-emitting element core 30 may face in the display direction. Another portion of the third element insulating film 382_1 positioned below the light-emitting element core 30 may face toward the first insulating layer 510.

For example, a thickness of the portion of the third element insulating film 382_1 overlapping the second insulating layer 520 and positioned above the light-emitting element core 30 and a thickness of the portion of the third element insulating film 382_1 positioned below the light-emitting element core 30 may be equal to each other. The portion of the third element insulating film 382_1 non-overlapping the second insulating layer 520 and positioned above the light-emitting element core 30 may have a thickness smaller than that of the portion of the third element insulating film 382_1 overlapping the second insulating layer 520 and positioned above the light-emitting element core 30. This may be achieved in case that a portion of the third element insulating film 382_1 is etched away during the manufacturing process of the display device 10.

For example, during the manufacturing process of the display device 10, the third element insulating film 382_1 may constitute an outer face of the light-emitting element ED disposed on a via layer 166, such that the third element insulating film 382_1 may protect the light-emitting element core 30 and the second element insulating film 381 from an etchant used in an etching process for forming members formed after the process of uniformly orienting the light-emitting elements ED. A portion of the third element insulating film 382_1 non-overlapping the second insulating layer 520 and exposed in the display direction may be etched. Accordingly, the third element insulating film 382_1 may have the thickness varying based on the areas.

Although the third element insulating film 382_1 is partially etched and removed during the manufacturing process of the display device 10, the third element insulating film 382_1 may be formed to have a thickness greater than a certain value, and the second element insulating film 381, the first element insulating film 39, and the light-emitting element core 30 may be stably protected. Therefore, as described above, in an embodiment, the thickness of the third element insulating film 382_1 may be greater than each of the thickness of the second element insulating film 381 and the thickness of the first element insulating film 39. However, the disclosure is not limited thereto. In the light-emitting element ED according to another embodiment, the thickness of the third element insulating film 382_1 may be smaller than or equal to the thickness of the second element insulating film 381, and may be greater than the thickness of the first element insulating film 39.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A light-emitting element comprising:
    a light-emitting element core including:
        a first semiconductor layer;
        a second semiconductor layer disposed on the first semiconductor layer; and
        a light-emitting layer disposed between the first semiconductor layer and the second semiconductor layer;
    a nitride insulating film completely surrounding a side face of the light-emitting element core from an end view perspective of the light-emitting element core;
    a first element insulating film completely surrounding an outer side face of the nitride insulating film from the end view perspective of the light-emitting element core; and
    a second element insulating film completely surrounding an outer side face of the first element insulating film from the end view perspective of the light-emitting element core,
    wherein a thickness of the nitride insulating film is smaller than each of a thickness of the first element insulating film and a thickness of the second element insulating film.

2. The light-emitting element of claim 1, wherein an inner side face of the nitride insulating film contacts the side face of the light-emitting element core.

3. The light-emitting element of claim 2, wherein the side face of the light-emitting element core includes at least one of a side face of the first semiconductor layer, a side face of the second semiconductor layer, and a side face of the light-emitting layer.

4. The light-emitting element of claim 1, wherein a thickness of the nitride insulating film is in a range of about 1 nm to about 5 nm.

5. The light-emitting element of claim 1, wherein a dielectric constant of the first element insulating film is greater than a dielectric constant of the second element insulating film.

6. The light-emitting element of claim 5, wherein an etching rate of the second element insulating film is different from an etching rate of the first element insulating film.

7. The light-emitting element of claim 5, wherein the first element insulating film has a dielectric constant of about 10 or greater and an energy gap of about 3 eV or higher.

8. The light-emitting element of claim 1, wherein the nitride insulating film has a thickness equal to or smaller than a critical thickness.

9. The light-emitting element of claim 1, wherein the nitride insulating film includes at least one of AlN and $SiN_x$.

10. The light-emitting element of claim 9, wherein the first element insulating film includes at least one of silicon oxide ($SiO_x$), aluminum oxide ($Al_xO_y$), hafnium silicon oxide ($HfSiO_x$), scandium oxide ($Sc_xO_y$), hafnium oxide ($HfO_x$), zirconium oxide ($ZrO_x$), strontium oxide (SrO), yttrium oxide ($Y_xO_y$), tantalum oxide ($Ta_xO_y$), barium oxide (BaO), tungsten oxide ($WO_x$), titanium oxide ($TiO_x$), and lanthanum oxide ($La_xO_y$).

11. A light-emitting element comprising:
    a light-emitting element core including:
        a first semiconductor layer;
        a light-emitting layer disposed on the first semiconductor layer; and
        a second semiconductor layer disposed on the light-emitting layer;
    a first element insulating film completely surrounding a side face of the light-emitting element core from an end view perspective of the light-emitting element core;
    a second element insulating film completely surrounding an outer side face of the first element insulating film from the end view perspective of the light-emitting element core; and
    a third element insulating film completely surrounding an outer side face of the second element insulating film from the end view perspective of the light-emitting element core, wherein
    the first element insulating film has a thickness in a range of about 1 nm to about 5 nm,
    a thickness of the second element insulating film is greater than a thickness of the first element insulating film, and
    a thickness of the third element insulating film is greater than the thickness of the first element insulating film.

12. The light-emitting element of claim 11, wherein the first element insulating film includes a nitride-based insulating material.

13. The light-emitting element of claim 11, wherein
    the first element insulating film contacts the side face of the light-emitting element core, and
    the side face of the light-emitting element core includes at least one of a side face of the first semiconductor layer, a side face of the second semiconductor layer, and a side face of the light-emitting layer.

14. The light-emitting element of claim 11, wherein a dielectric constant of the second element insulating film is greater than a dielectric constant of the third element insulating film.

15. A display device comprising:
    a first electrode and a second electrode disposed on a substrate and spaced apart from each other; and a light-emitting element disposed on the first electrode and the second electrode,
wherein
the light-emitting element includes:
a light-emitting element core including:
a first semiconductor layer;
a second semiconductor layer disposed on the first semiconductor layer; and
a light-emitting layer disposed between the first semiconductor layer and the second semiconductor layer;
a nitride insulating film completely surrounding a side face of the light-emitting element core from an end view perspective of the light-emitting element core;
a first element insulating film completely surrounding an outer side face of the nitride insulating film from the end view perspective of the light-emitting element core; and
a second element insulating film completely surrounding an outer side face of the first element insulating film from the end view perspective of the light-emitting element core, wherein
a thickness of the nitride insulating film is smaller than each of a thickness of the first element insulating film and a thickness of the second element insulating film.

16. The display device of claim 15, wherein an inner side face of the nitride insulating film contacts the side face of the light-emitting element core.

17. The display device of claim 15, wherein a thickness of the nitride insulating film is in a range of about 1 nm to about 5 nm.

18. The display device of claim 15, wherein a dielectric constant of the first element insulating film is greater than a dielectric constant of the second element insulating film.

19. The display device of claim 15, wherein the nitride insulating film has a thickness equal to or smaller than a critical thickness.

20. An electronic device comprising:
a first electrode and a second electrode disposed on a substrate and spaced apart from each other; and
a light-emitting element disposed on the first electrode and the second electrode, wherein
the light-emitting element includes:
a light-emitting element core including:
a first semiconductor layer;
a second semiconductor layer disposed on the first semiconductor layer; and
a light-emitting layer disposed between the first semiconductor layer and the second semiconductor layer;
a nitride insulating film completely surrounding a side face of the light-emitting element core from an end view perspective of the light-emitting element core;
a first element insulating film completely surrounding an outer side face of the nitride insulating film from the end view perspective of the light-emitting element core; and
a second element insulating film completely surrounding an outer side face of the first element insulating film from the end view perspective of the light-emitting element core,
wherein a thickness of the nitride insulating film is smaller than each of a thickness of the first element insulating film and a thickness of the second element insulating film.

* * * * *